(12) United States Patent
Haneda et al.

(10) Patent No.: US 10,320,410 B2
(45) Date of Patent: Jun. 11, 2019

(54) SUCCESSIVE APPROXIMATION TYPE A/D CONVERSION CIRCUIT

(71) Applicant: Seiko Epson Corporation, Tokyo (JP)

(72) Inventors: Hideo Haneda, Matsumoto (JP); Atsushi Tanaka, Tatsuno (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/926,199

(22) Filed: Mar. 20, 2018

(65) Prior Publication Data

US 2018/0287626 A1    Oct. 4, 2018

(30) Foreign Application Priority Data

Mar. 28, 2017  (JP) ................................ 2017-062056

(51) Int. Cl.
*H03M 1/06* (2006.01)
*H03M 1/10* (2006.01)
*H03M 1/46* (2006.01)

(52) U.S. Cl.
CPC ......... *H03M 1/468* (2013.01); *H03M 1/0641* (2013.01); *H03M 1/1019* (2013.01)

(58) Field of Classification Search
CPC ........................... H03M 1/468; H03M 1/1019
USPC ................................................ 341/100–155
See application file for complete search history.

(56) References Cited

U.S. PATENT DOCUMENTS

| 4,991,207 | A  | * | 2/1991  | Shiraishi | ............... | H04H 60/15  |
|           |    |   |         |           |                | 370/312     |
| 5,832,021 | A  | * | 11/1998 | Kondo     | ................. | H04B 1/7085 |
|           |    |   |         |           |                | 375/150     |
| 8,094,057 | B2 | * | 1/2012  | Haneda    | ............... | H03M 1/0639 |
|           |    |   |         |           |                | 341/144     |
| 8,482,446 | B2 | * | 7/2013  | Haneda    | ................... | H03M 1/12   |
|           |    |   |         |           |                | 341/155     |
| 2010/0123611 | A1 | * | 5/2010 | Cho    | ...................... | H03M 1/069 |
|              |    |   |        |        |                        | 341/156    |
| 2010/0283645 | A1 | * | 11/2010 | Haneda | ............... | H03M 1/0639 |
|              |    |   |         |        |                | 341/122     |
| 2011/0227774 | A1 | * | 9/2011 | Cho    | .................... | H03M 1/0678 |
|              |    |   |        |        |                    | 341/172     |
| 2012/0112938 | A1 | * | 5/2012 | Haneda | ................... | H03M 1/12   |
|              |    |   |        |        |                     | 341/110     |
| 2012/0229313 | A1 | * | 9/2012 | Sin    | ...................... | H03M 1/1225 |
|              |    |   |        |        |                        | 341/110     |
| 2013/0006433 | A1 | * | 1/2013 | Itagaki | .................... | H02H 7/26   |
|              |    |   |        |         |                     | 700/292     |

(Continued)

FOREIGN PATENT DOCUMENTS

JP    2010-263399 A    11/2010
JP    2012-104938 A     5/2012

(Continued)

*Primary Examiner* — Lam T Mai
(74) *Attorney, Agent, or Firm* — Harness, Dickey & Pierce, P.L.C.

(57) ABSTRACT

A circuit device includes a code data generation circuit that generates code data which changes with time, and a successive approximation type A/D conversion circuit that performs code shift based on the code data and performs A/D conversion of an input signal. The code data generation circuit generates error data of which a frequency characteristic has a shaping characteristic and converts the error data into the code data.

17 Claims, 16 Drawing Sheets

(56) References Cited

U.S. PATENT DOCUMENTS

2013/0278453 A1* 10/2013 Steensgaard-Madsen ................... H03M 1/0668
341/110
2015/0249801 A1* 9/2015 Tokunaga .............. H04N 5/378
341/155

FOREIGN PATENT DOCUMENTS

JP         2013-192273 A    9/2013
JP         2014-200116 A    10/2014

* cited by examiner

| RMD1 | | DAR (DECIMAL NUMBER) |
|---|---|---|
| BINARY | DECIMAL NUMBER | |
| 1111 | 15 | +7 |
| 1110 | 14 | +6 |
| ⋮ | ⋮ | ⋮ |
| 1000 | 8 | 0 |
| ⋮ | ⋮ | ⋮ |
| 0010 | 2 | −6 |
| 0001 | 1 | −7 |
| 0000 | 0→RMD2 | |

FIG. 14

SUCCESSIVE APPROXIMATION TYPE A/D CONVERSION CIRCUIT

BACKGROUND

1. Technical Field

The present invention relates to a circuit device, a physical quantity measurement device, an electronic apparatus, and a vehicle.

2. Related Art

A successive approximation type A/D conversion circuit that performs A/D conversion of a sampling signal of an input signal through a successive approximation operation is known in the related art. A method is known in which the A/D conversion circuit performs code shift using code data changing with time, and thereby, differential nonlinearity (DNL) and integral nonlinearity (INL) are improved. For example, JP-A-2010-263399 discloses a comparison circuit, an A/D conversion circuit including a successive approximation register of which a register value is updated based on a comparison result, a first D/A conversion circuit that performs D/A conversion of the register value, a code data generation circuit that generates code data which changes with time, and a second D/A conversion circuit that performs D/A conversion of the code data.

In the A/D conversion circuit described above, in a case where there is nonlinearity in a D/A conversion circuit that performs D/A conversion of code data, there is a possibility that an error due to the nonlinearity is added to A/D conversion data. Since the code data is generated by, for example, a linear feedback shift register (LFSR) or the like, periodicity occurs in the code data due to a cycle in which codes of the linear feedback shift register circulate. By doing so, there is a concern that the periodicity occurs in the error of the A/D conversion data due to the periodicity of the code data, thereby, becoming noise components of a characteristic frequency. There is a concern that the noise components of the characteristic frequency influence an Allan dispersion characteristic (for example, characteristic of relatively long $\tau$) of the A/D conversion circuit.

SUMMARY

An advantage of some aspects of the invention is to solve at least a part of the problems described above, and the invention can be implemented as the following forms or embodiments.

An aspect of the invention relates to a circuit device including a code data generation circuit that generates code data which changes with time, and a successive approximation type A/D conversion circuit that performs code shift based on the code data and performs A/D conversion of an input signal, in which the code data generation circuit generates error data of which a frequency characteristic has a shaping characteristic and converts the error data into the code data.

According to the aspect of the invention, error data having a frequency characteristic of a shaping characteristic is generated, the error data is converted into code data, code shift is performed based on the code data, and A/D conversion of an input signal is performed. Thereby, it is possible to make an error of A/D conversion data due to the code shift as an error corresponding to the error data, and to make the error of the A/D conversion data have the shaping characteristic. Since the error of the A/D conversion data due to the code shift has the shaping characteristic, a concern that code shift influences an Allan dispersion characteristic can be reduced in the successive approximation type A/D conversion circuit.

In the aspect of the invention, the code data generation circuit may convert the error data into the code data by an inverse function of a function of converting the code data into the error data.

According to this configuration, a function of converting code data into error data is appropriately set, and thereby, a frequency characteristic of an error of A/D conversion data can become the same (substantially the same) as a frequency characteristic of the error data. Thereby, the error of the A/D conversion data can have the shaping characteristic.

In the aspect of the invention, the A/D conversion circuit may include a D/A conversion circuit for code data that performs D/A conversion of the code data, and the function may be a function based on a conversion characteristic of the D/A conversion circuit for code data.

An inverse function of a function of converting code data into error data is a function of converting error data into code data. By setting the function of converting the code data into the error data, based on a conversion characteristic of a D/A conversion circuit for code data, an error propagation function of a system can become approximately 1 (or integer). Thereby, an error of A/D conversion data due to code shift has the same (substantially the same) frequency characteristic as the error data.

In the aspect of the invention, when the code data is referred to as CS, predetermined values corresponding to a range of the code data are referred to as CM and CA, the error data is referred to as ERR, and the function is referred to as f, ERR=f(CS)=(CM−CS)/CA at CS>0, ERR=f(CS)=0 at CS=0, ERR=f(CS)=−(CM+CS)/CA at CS<0 may be satisfied.

By adopting such a function f, it is possible to set the function f according to nonlinearity estimated to be possessed by a D/A conversion circuit for code data. That is, it is possible to set a function as a function f, based on a conversion characteristic of the D/A conversion circuit for code data.

In the aspect of the invention, the code data generation circuit may include a data generation circuit, a modulation circuit that modulates generation data from the data generation circuit to generate the error data, and a conversion circuit that converts the error data into the code data.

As in this manner, a code data generation circuit includes a modulation circuit, and thus, it is possible to generate error data having a frequency characteristic of a shaping characteristic. In addition, since the code data generation circuit includes a conversion circuit, the error data can be converted into code data.

In the aspect of the invention, the modulation circuit may perform $\Delta\Sigma$ modulation of an n-th order (n is an integer of one or more) for the generation data to generate the error data.

As in this manner, error data having a shaping characteristic can be generated by performing $\Delta\Sigma$ modulation of an n-th order for generation data. Due to the shaping characteristic of the error data, an error of A/D conversion data due to code shift can have the shaping characteristic.

In the aspect of the invention, the data generation circuit may generate pseudo random number data as the generation data.

According to this configuration, code data is generated by modulating pseudo random number data. Periodicity of the code data can be reduced by using the pseudo random number data, but there is a concern that the periodicity may remain in the code data by an operation cycle of a data generation circuit. In the present embodiment, by modulating the pseudo random number data, it is possible to reduce influence of the periodicity of the code data on an Allan dispersion characteristic of A/D conversion data.

In the aspect of the invention, the data generation circuit may output the generation data, based on the pseudo random number data and second random number data.

According to this configuration, generation data with higher randomness can be generated. For example, in a case where occurrence frequency of each code of the generation data is not uniform, the occurrence frequency can be made more uniform.

In the aspect of the invention, the A/D conversion circuit may include a comparison circuit, a control circuit that includes a successive approximation register in which a register value is set by a comparison result signal from the comparison circuit and outputs successive approximation data, a D/A conversion circuit for successive approximation data that performs D/A conversion of the successive approximation data from the control circuit and outputs a D/A output signal corresponding to the successive approximation data, and a D/A conversion circuit for code data that performs D/A conversion of the code data and outputs a code signal corresponding to the code data. The comparison circuit may perform processing of comparing an addition signal which is obtained by adding a sampling signal of the input signal to the code signal with the D/A output signal, or may perform processing of comparing the sampling signal with an addition signal which is obtained by adding the D/A output signal to the code signal. The control circuit may output output data which is obtained based on successive approximation result data of the successive approximation register and the code data as A/D conversion data of the input signal.

In a case where a D/A conversion circuit for successive approximation data has nonlinearity, there is a concern that the nonlinearity causes nonlinearity in an A/D conversion characteristic. According to the aspect of the invention, successive approximation result data with respect to an input signal can be changed by using code data that changes with time. Thereby, the nonlinearity is dispersed with time, and a characteristic of an A/D conversion circuit viewed in time average can be improved. For example, codes generated by a missing code can be dispersed with time.

In the aspect of the invention, the circuit device may further include a drive circuit that drives a physical quantity transducer, and a detection circuit that receives a detection signal from the physical quantity transducer and detects a physical quantity signal corresponding to physical quantity. The detection circuit may include the A/D conversion circuit that performs A/D conversion of the input signal, based on the detection signal.

According to this configuration, code shift can be performed based on code data generated based on error data having a shaping characteristic, and A/D conversion of an input signal can be performed based on a detection signal. Thereby, a physical quantity signal can be detected by an A/D conversion circuit in which an Allan dispersion characteristic is improved, and physical quantity can be detected with high accuracy.

Another aspect of the invention relates to a physical quantity measurement device including the circuit device described in the aspect and the physical quantity transducer.

Still another aspect of the invention relates to an electronic apparatus including the circuit device described in any one of the aspects.

Still another aspect of the invention relates to a vehicle including the circuit device described in any one of the aspects.

BRIEF DESCRIPTION OF THE DRAWINGS

The invention will be described with reference to the accompanying drawings, wherein like numbers reference like elements.

FIG. 14 is a diagram illustrating an operation of the modification example of the data generation circuit.

DESCRIPTION OF EXEMPLARY EMBODIMENTS

Hereinafter, preferred embodiments according to the invention will be described in detail. The present embodiments which will be described below do not unduly limit contents of the invention described in the appended Claims, and all of the configurations described in the present embodiments are not necessarily indispensable as means for solving the invention.

1. Comparative Example

Figure 1:
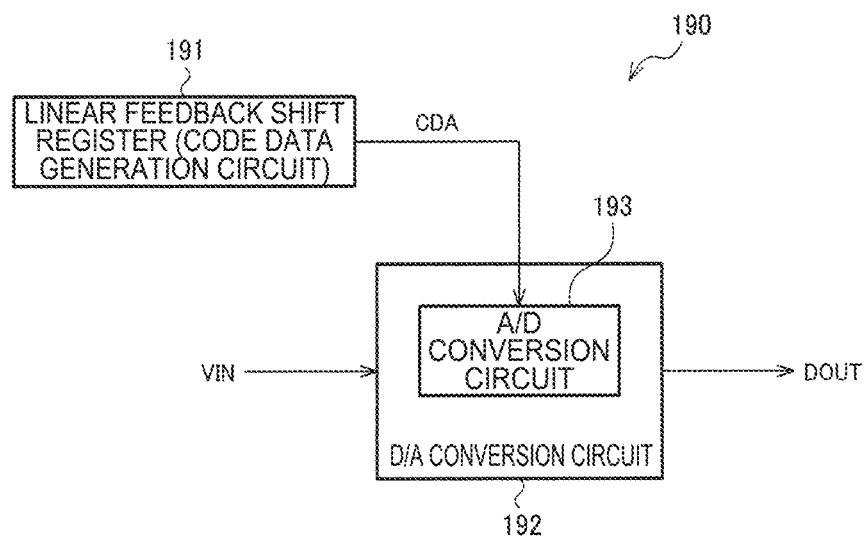
FIG. 1 is a comparative example of a circuit device.

FIG. 1 is a comparative example of a circuit device. The circuit device 190 includes a linear feedback shift register 191 (code data generation circuit) and an A/D conversion circuit 192.

The linear feedback shift register 191 generates, for example, pseudo random number data and the like, and outputs the generated data as code data CDA. The A/D conversion circuit 192 is a successive approximation type A/D conversion circuit which performs A/D conversion of an input signal VIN (input voltage), and outputs the conversion results as A/D conversion data DOUT. The A/D conversion circuit 192 includes a D/A conversion circuit 193 for code data that performs D/A conversion of the code data CDA. An A/D conversion value for the input signal VIN is shifted (code-shifted) by using an output signal of the D/A conversion circuit for code data by the code data CDA. A value obtained by subtracting the code data CDA from the obtained A/D conversion value is output as A/D conversion data DOUT.

It is assumed that an output signal of the D/A conversion circuit 193 for code data has nonlinearity with respect to the code data CDA, in the A/D conversion circuit. By doing so, the output signal of the D/A conversion circuit 193 for code data includes ideal components corresponding to the code data CDA and error components due to nonlinearity. The ideal components are removed when subtracting the code data CDA from the A/D conversion value, but the error components are not removed, and thereby, data corresponding to the error components remain in the A/D conversion data DOUT.

Figure 2:
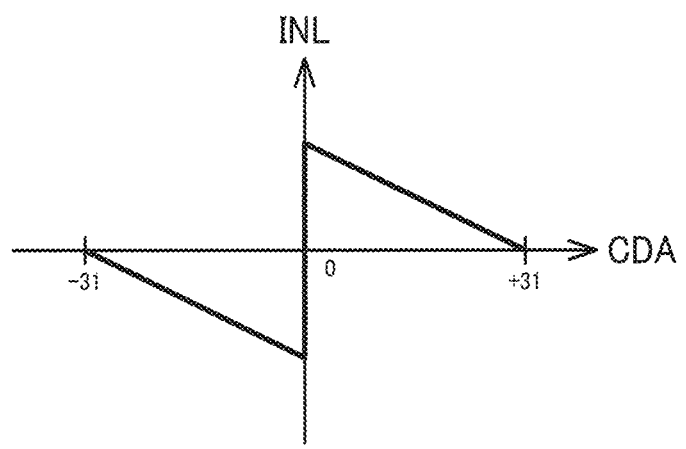
FIG. 2 is a characteristic example of integral nonlinearity of a D/A conversion circuit for code data.

FIG. 2 is a characteristic example of integral nonlinearity of the D/A conversion circuit for code data. An error corresponding to the integral nonlinearity appears as an error of the A/D conversion data DOUT. In the example of FIG. 2, a range of the code data CDA is from −31 to +31, and a value of the integral nonlinearity greatly changes at the center (CDA=0) of the range. The characteristic corresponds to a conversion characteristic of the D/A conversion circuit for code data, and FIG. 2 is one example of the characteristic.

Figure 18:
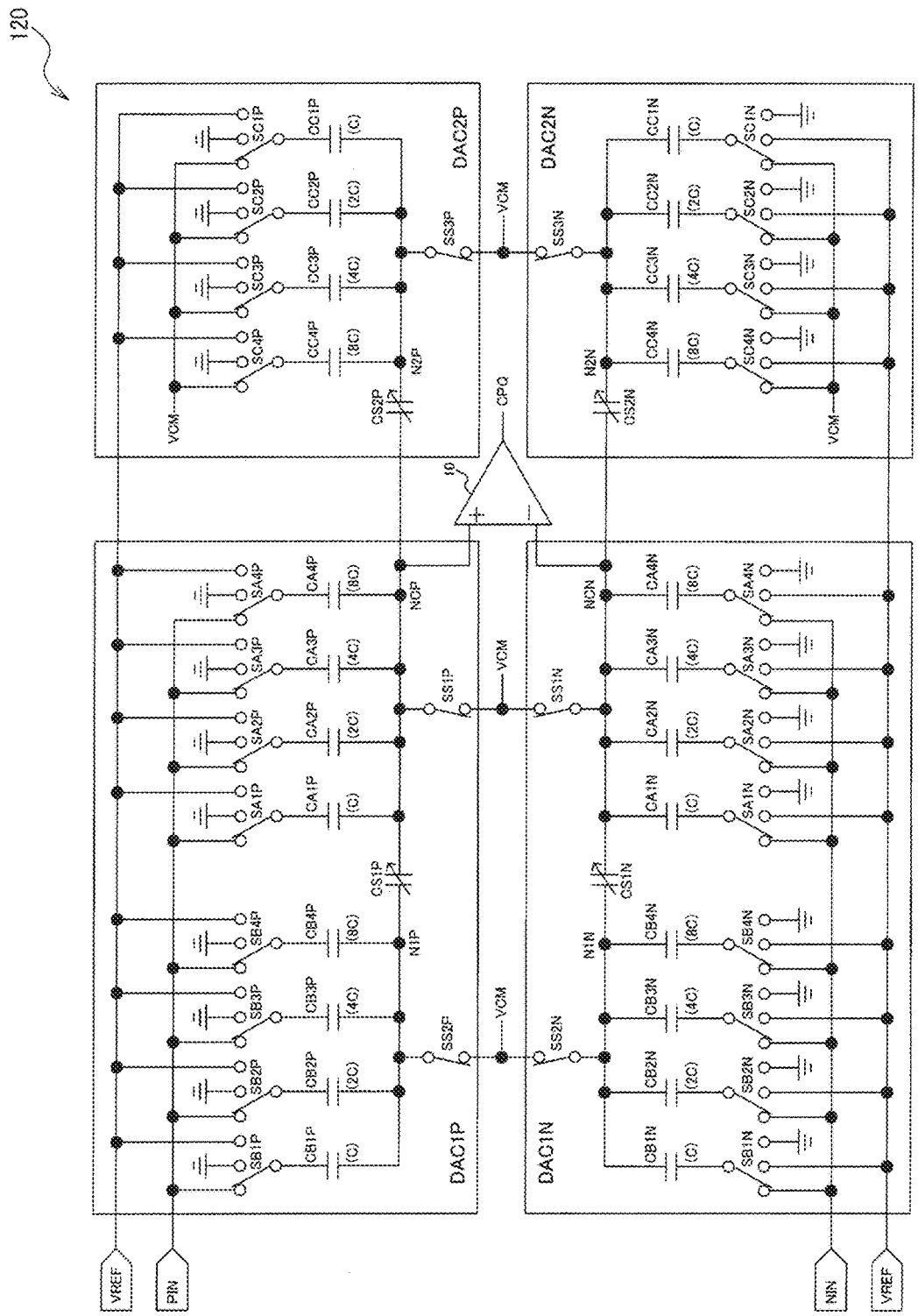
FIG. 18 is a second detailed configuration example of the A/D conversion circuit.

For example, in the A/D conversion circuit which will be described below with reference to FIG. 16, DAC2 corresponds to a D/A conversion circuit for code data. Capacitors CC1, CC2, CC3, and CC4 of DAC2 have capacitance values weighted to C, 2C, 4C, and 8C, when a capacitance value of a unit capacitor is set to C. Since there is variation in the capacitance value of the unit capacitor, integral nonlinearity occurs due to the variation. Since the DAC2 performs D/A conversion of code data configured with four bits, a range of the code data CDA is 0 to +15. CDA=0 is "0000" and CDA=+15 is "1111". Switch elements SC1, SC2, SC3 and SC4 are controlled by the LSB, the second bit, the third bit, and the MSB of the code data CDA, select a reference voltage VREF when the bit is "1", and select a ground voltage GND when the bit is "0". Accordingly, CDA=+7 is "0111", CDA=+8 is "1000", node voltages of one terminal of each of the capacitors CC1 to CC4 are replaced with VREF and GND during that time, and a change of a value of the integral nonlinearity is expected to be maximized. In addition, in a case where differential D/A conversion circuits (DAC2P and DAC2N) are used as illustrated in FIG. 18, a range of the code data CDA is from −7 to +7. In the example of FIG. 18, the MSB of the code data CDA is considered as a bit obtained by inverting a sign bit of two's complement. That is, since CDA=−1 is "1111" in two's complement, the sign bit is inverted, and thereby, CDA becomes "0111", and since CDA=0 is "0000" in two's complement, the sign bit is inverted and thereby, CDA becomes "1000". Accordingly, the node voltages of one terminal of each of all the capacitors CC1P to CC4P and CC1N to CC4N are switched between VREF and GND, between CDA=−1 ("0111") and CDA=0 ("1000"), and the change of the value of the integral nonlinearity is expected to be maximized. From this, the characteristic of the integral nonlinearity of the D/A conversion circuit for code data is expected to be as illustrated in FIG. 2.

Figure 3:
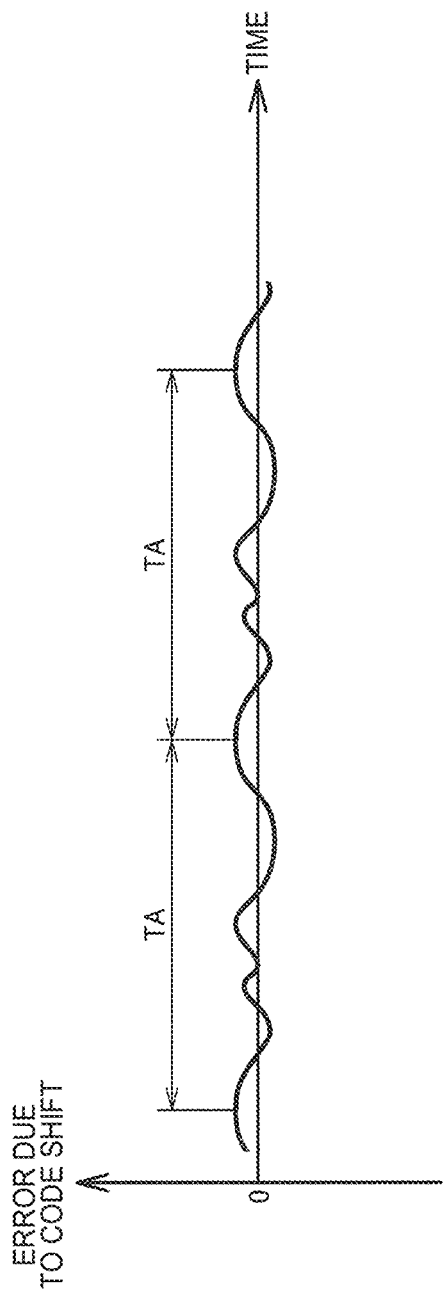
FIG. 3 is a diagram schematically illustrating a time change of an error of A/D conversion data due to code shift.

FIG. 3 is a diagram schematically illustrating a time change of an error of the A/D conversion data due to code shift. As illustrated in FIG. 1, the code data CDA which changes with time is generated by the linear feedback shift register 191, and as described in FIG. 2, an error (value of integral nonlinearity) changes depending on the code data CDA. Accordingly, as illustrated in FIG. 3, the error of the A/D conversion data due to the code shift varies with time.

In the linear feedback shift register 191, a generated code circulates in a predetermined cycle, and thereby, the code data CDA has periodicity. If the cycle is referred to as TA, the error of the A/D conversion data due to the code shift repeats the same waveform at each cycle TA. Accordingly, the error of the A/D conversion data due to the code shift includes periodic components.

Figure 4:
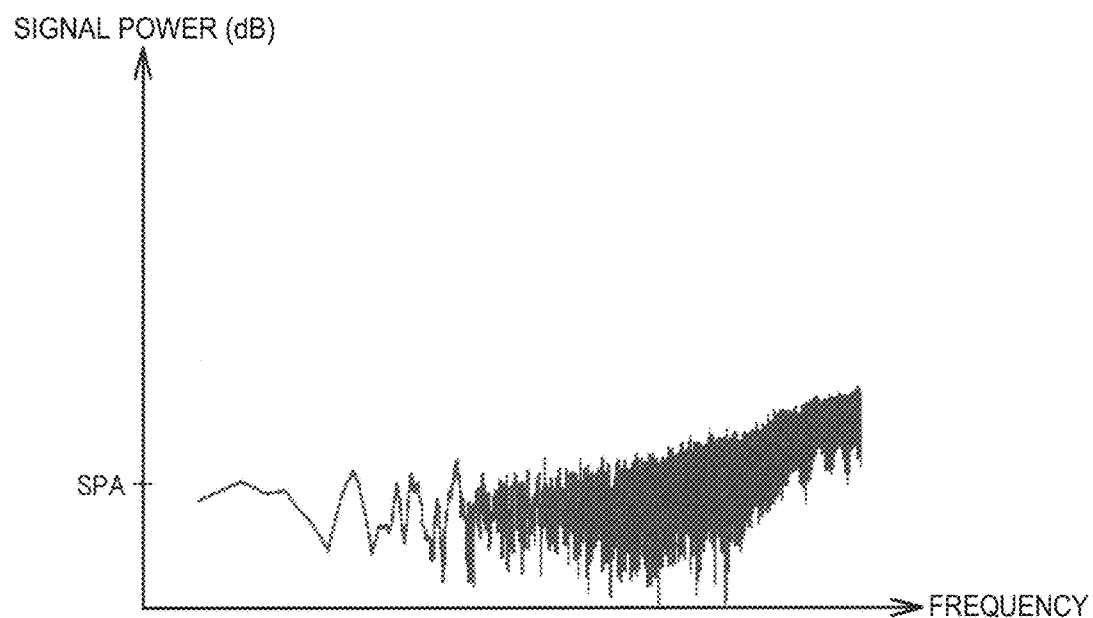
FIG. 4 is an example of a frequency characteristic of an error of the A/D conversion data due to the code shift, in the comparative example.
Figure 5:
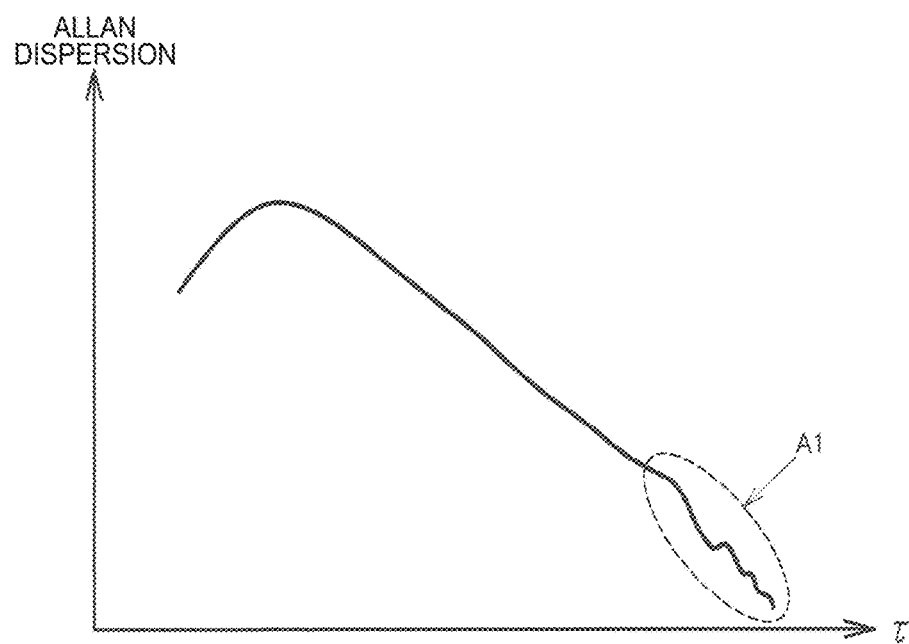
FIG. 5 is an example of an Allan dispersion characteristic of the A/D conversion data in the comparative example.

FIG. 4 is an example of a frequency characteristic of the error of the A/D conversion data due to the code shift, in the comparative example. FIG. 4 illustrates simulation results obtained by performing a Fourier transformation on the time change of the error. In addition, FIG. 5 is an example of an Allan dispersion characteristic of the A/D conversion data in a comparative example. Allan dispersion is an index for evaluating noise with time, and is an index obtained by normalizing dispersion of errors occurring during a time interval t with time.

As illustrated in FIG. 4, frequency components (signal power) of the error have a relatively flat characteristic even on a low frequency side. SPA indicates an approximate signal power level on the low frequency side. The frequency components on the low frequency side may influence a characteristic of a long-time interval t in the Allan dispersion illustrated in FIG. 5. For example, if a time domain type comparator is used for a comparison circuit of the A/D conversion circuit, the comparison circuit is not influenced by 1/f noise of an amplification circuit, and thus, it is possible to obtain a characteristic that the Allan dispersion decreases as τ increases. However, as denoted by A1 in FIG. 5, there is a possibility that the frequency components of the error of the A/D conversion data disrupt (causes a peak) the characteristic of the Allan dispersion in a region where i is large.

2. Circuit Device

Figure 6:
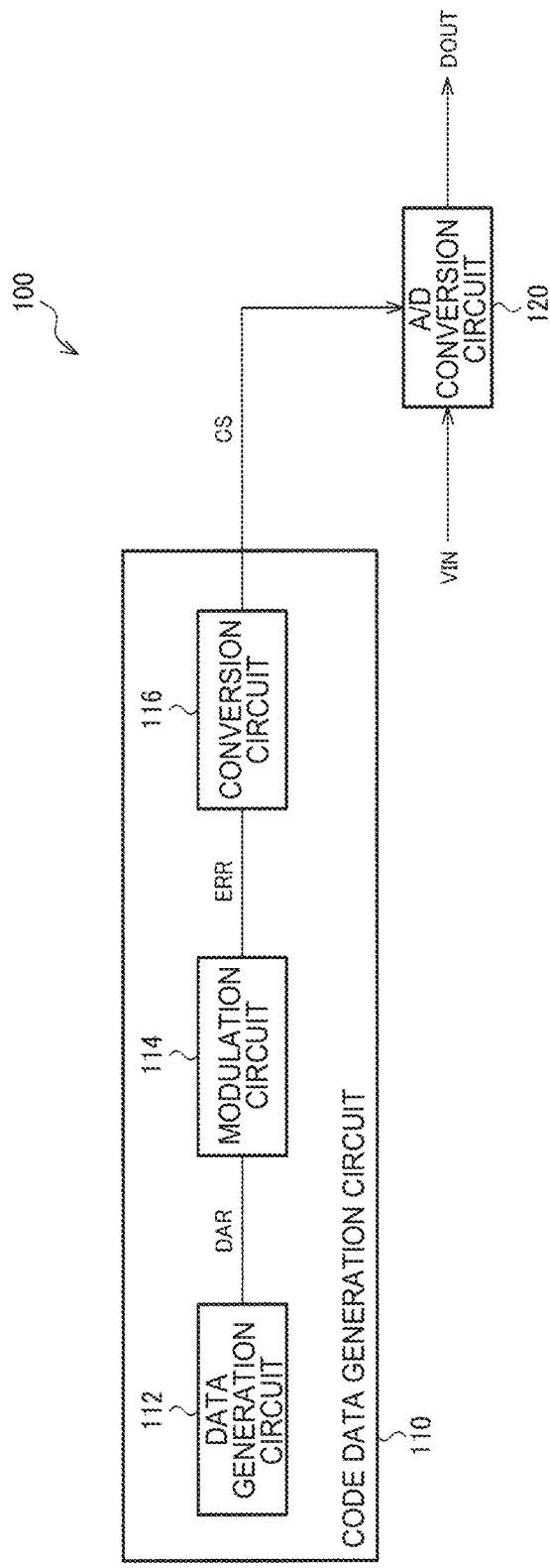
FIG. 6 is a configuration example of a circuit device according to the present embodiment.

FIG. 6 is a configuration example of the circuit device according to the present embodiment. The circuit device 100 includes a code data generation circuit 110 and an A/D conversion circuit 120. The present embodiment is not limited to the configuration of FIG. 6, and various modifications such as omitting a part of the configuration elements and adding other configuration elements can be made.

The code data generation circuit 110 generates code data CS which changes with time. The A/D conversion circuit 120 is a successive approximation type A/D conversion circuit, performs code shift, based on the code data CS, and performs A/D conversion of an input signal VIN (input voltage). The code data generation circuit 110 generates error data ERR of which a frequency characteristic has a shaping characteristic, and converts the error data ERR into the code data CS.

Specifically, the A/D conversion circuit 120 compares a signal obtained by performing D/A conversion of the successive approximation data with the input signal VIN, updates the successive approximation data, based on the comparison results, and converts the input signal VIN into A/D conversion data DOUT by repeating the updating. An operation of obtaining one piece of A/D conversion data DOUT from the input signal VIN is defined as an A/D conversion operation of one time.

The code data generation circuit 110 outputs different code data CS in each A/D conversion operation. At this time, the code data generation circuit 110 generates the code data CS by converting the error data ERR into the code data CS. The error data ERR corresponds to an error of the A/D conversion data DOUT due to code shift (due to integral nonlinearity of the D/A conversion circuit for code data). That is, when the A/D conversion circuit 120 performs the code shift based on the code data CS and outputs the A/D conversion data DOUT, an error assumed to be included in the A/D conversion data DOUT is error data ERR. Since the code data generation circuit 110 generates the error data ERR having a shaping characteristic, the error included in the A/D conversion data DOUT also has the shaping characteristic. The shaping characteristic is a high-pass frequency characteristic in which frequency components (noise components) on a low frequency side are suppressed. In the present embodiment, the error data ERR is generated from the generation data DAR, but the frequency components on the low frequency side in the frequency characteristic of the generation data DAR are suppressed in the error data ERR.

As such, by converting the error data ERR into the code data CS, the error of the A/D conversion data DOUT due to the code shift can be an error corresponding to the error data ERR. Thereby, the low frequency components of the error of the A/D conversion data DOUT due to the code shift can be controlled by the frequency characteristic of the error data ERR. That is, by generating the error data ERR of which the frequency characteristic has a shaping characteristic, the error of the A/D conversion data DOUT due to the code shift can have the shaping characteristic. Since the error has the shaping characteristic, the frequency components on the low frequency side are reduced, and thereby, the Allan dispersion characteristic (for example, the characteristic in a relatively long-time interval τ) of the A/D conversion circuit 120 can be improved.

As illustrated in FIG. 6, the code data generation circuit 110 includes a data generation circuit 112, a modulation circuit 114 that modulates the generation data DAR from the data generation circuit 112 to generate the error data ERR, and a conversion circuit 116 that converts the error data ERR into the code data CS.

Specifically, the data generation circuit 112 generates the generation data DAR that is random data in time series (data changing with time). For example, the generation data DAR is pseudo random number data. The modulation circuit 114 performs modulation of shaping the frequency characteristic of the error data ERR. For example, a ΔΣ modulation can be adopted as the modulation. The conversion circuit 116 converts the error data ERR into code data CS by using a predetermined conversion function. Considering that the A/D conversion circuit 120 converts the code data CS into an error of the A/D conversion data DOUT, an inverse function of (a model of) a conversion function thereof is a predetermined conversion function.

As such, by providing the modulation circuit 114 in the code data generation circuit 110, the error data ERR of which the frequency characteristic has the shaping characteristic can be generated. In addition, by providing the conversion circuit 116 in the code data generation circuit 110, the error data ERR can be converted into the code data CS.

Figure 7:
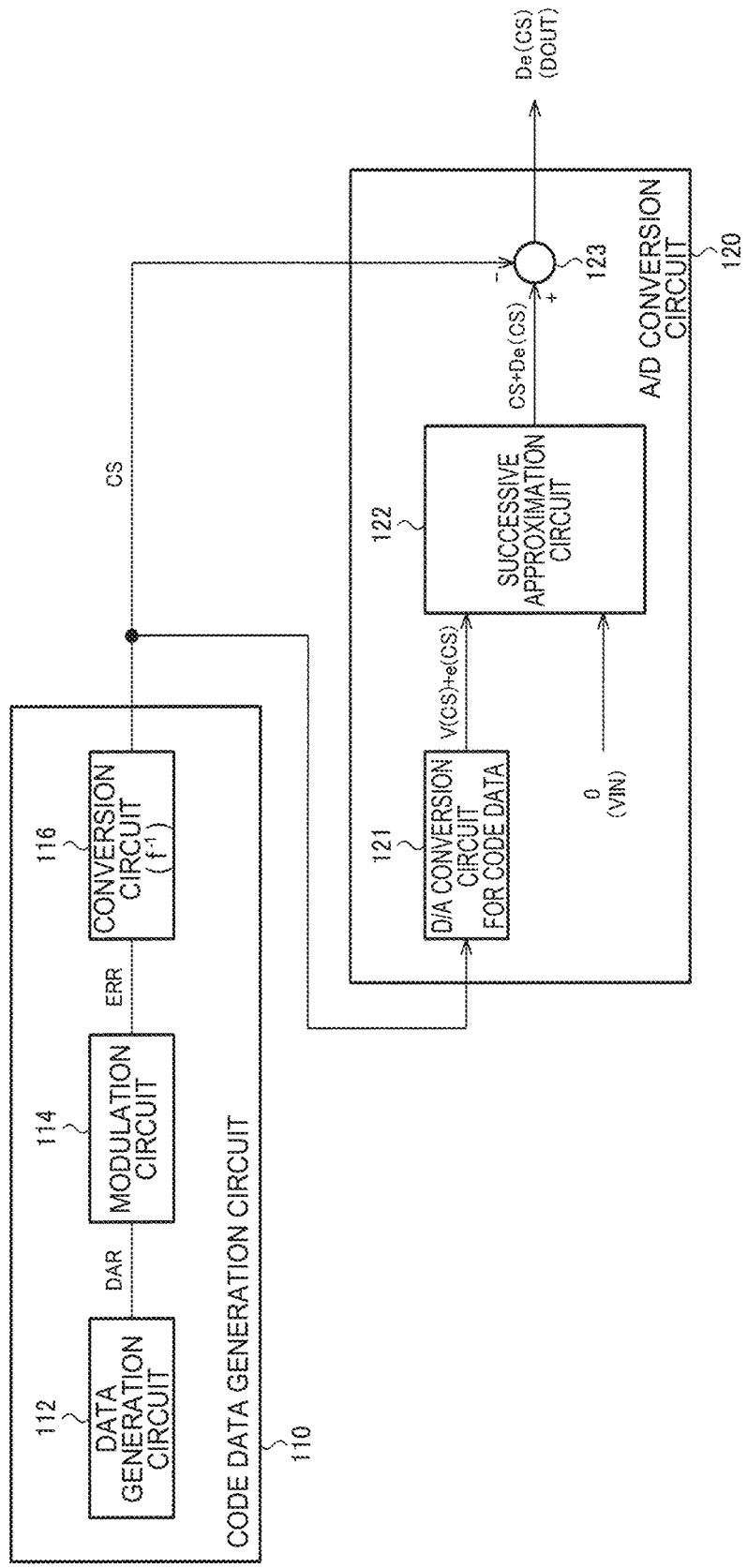
FIG. 7 is a principle explanatory diagram of a method according to the present embodiment.

FIG. 7 is a principle explanatory diagram of a method according to the present embodiment. As illustrated in FIG. 7, the A/D conversion circuit 120 includes a D/A conversion circuit 121 for code data, a successive approximation circuit 122, and a subtraction circuit 123. For example, in the A/D conversion circuit of FIG. 15, DAC2 corresponds to the D/A conversion circuit 121 for code data, and an S/H circuit 30, DAC1, a comparison circuit 10, and a control circuit 20 correspond to the successive approximation circuit 122 and the subtraction circuit 123. In FIG. 7, it is assumed that the input signal is VIN=0 and the successive approximation circuit 122 has an ideal A/D conversion characteristic (no differential nonlinearity and integral nonlinearity).

The conversion circuit 116 converts the error data ERR into the code data CS by using an inverse function $f^{-1}$ (ERR)=CS of a function f (CS)=ERR indicating a relationship between the code data CS and the error data ERR. The D/A conversion circuit 121 for code data performs D/A conversion of the code data CS and outputs a signal V (CS)+e (CS). V (CS) is an ideal D/A conversion result, and e (CS) is an error due to nonlinearity of the D/A conversion circuit 121 for code data. The successive approximation circuit 122 outputs an A/D converted value CS+De (CS) corresponding to VIN+V (CS)+e (CS)=V (CS)+e (CS). De (CS) corresponds to the A/D conversion result of e (CS). The subtraction circuit 123 subtracts the code data CS from the A/D converted value CS+De (CS), and outputs the A/D conversion data DOUT=De (CS).

As such, it can be seen that the A/D conversion data DOUT includes the error data De (CS) corresponding to the code data CS. De (CS) is a function of converting the code data CS into the error data. If the inverse function $f^{-1}$ (ERR)=CS used in the conversion circuit 116 is inserted into De (CS), De (CS)=De ($f^{-1}$ (ERR)). In the present embodiment, a function having the same (substantially the same) characteristic as the function De is adopted as the function f. Thereby, De (CS)=De ($De^{-1}$ (ERR))=ERR, and the shaping characteristic of the error data ERR generated by the modulation circuit 114 is reflected in the error data De (CS) of the A/D conversion data DOUT.

De ($f^{-1}$ (ERR)) corresponds to an error propagation function of a system. In the present embodiment, the function f is set such that calculation results of the error propagation function De ($f^{-1}$ (ERR)) become approximately ERR (or constant×ERR). Since the characteristic of De is determined by the characteristic of the D/A conversion circuit 121 for code data, a function having the same (substantially the same) characteristic as the function e representing the nonlinearity is adopted as the function f. For example, the function e is estimated from an operation of the D/A conversion circuit 121 for code data, and the estimated function is set to the function f.

In the above embodiment, the code data generation circuit 110 converts the error data ERR into the code data CS by using the inverse function $f^{-1}$ of the function f that converts the code data CS into the error data ERR.

By doing so, the function f of converting the code data CS into the error data ERR is appropriately set, and thereby, the frequency characteristic of the error data De (CS) of the A/D conversion data DOUT can become the same (substantially the same) as the frequency characteristic of the error data ERR. Thereby, the error data De (CS) of the A/D conversion data DOUT can have the shaping characteristic.

In the present embodiment, the A/D conversion circuit 120 includes the D/A conversion circuit 121 for code data that performs D/A conversion of the code data CS. The function f is a function based on the conversion characteristic of the D/A conversion circuit 121 for code data.

The conversion characteristic of the D/A conversion circuit 121 for code data is represented by V (CS)+e (CS). By setting the function f, based on the error components e (CS), calculation results of the error propagation function De ($f^{-1}$ (ERR)) of a system can become approximately ERR (or constant×ERR). Thereby, the error data De (CS) of the A/D conversion data DOUT due to code shift can be the same (substantially the same) as the error data ERR.

3. Detailed Configuration Example

Figure 8:
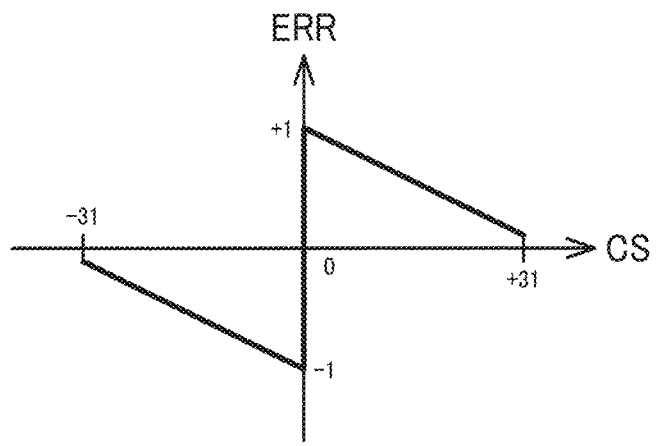
FIG. 8 is a characteristic example of a function of converting the code data into error data.

FIG. 8 is a characteristic example of a function of converting code data into error data. The function f is represented by following Formula (1). Following Formula (1) is an example in a case where a range of the code data CS is −31 to +31.

$$ERR = f(CS) = \begin{cases} (32 - CS)/31 & (CS > 0) \\ 0 & (CS = 0) \\ -(32 + CS)/31 & (CS < 0) \end{cases} \quad (1)$$

The nonlinearity (integral nonlinearity) of the D/A conversion circuit for code data has the characteristic illustrated in FIG. 2. The function f of Formula (1) is set based on the nonlinearity. The conversion circuit 116 converts the error data ERR into the code data CS by using the inverse function $f^{-1}$ of the function f of Formula (1). For example, the conversion circuit 116 performs calculation processing of the inverse function $f^{-1}$ by using a digital signal processor (DSP), a dedicated logic circuit, and the like. In a case of using the DSP, the function of the conversion circuit 116 is realized by apart of a plurality of processes performed by the DSP in a time sharing manner. Alternatively, the conversion circuit 116 may store a lookup table corresponding to the inverse function $f^{-1}$ and may convert the error data ERR into the code data CS by using the lookup table.

According to the above embodiment, when predetermined values corresponding to the range of the code data CS are referred to as CM and CA, the function f is represented by following Formula (2).

$$ERR = f(CS) = \begin{cases} (CM - CS)/CA & (CS > 0) \\ 0 & (CS = 0) \\ -(CM + CS)/CA & (CS < 0) \end{cases} \quad (2)$$

If Formula (1) is compared with Formula (2), the predetermined values are CM=32 and CA=31. That is, in a case where the range of the code data CS is −CA to CA, ½ of a size (CA−(−CA)=2CA) of the range becomes the predetermined value CA. In addition, the predetermined value CM=CA+1.

By adopting the function f, the function f according to the nonlinearity assumed to be included in a general D/A conversion circuit can be set. For example, in a capacitor array type D/A conversion circuit illustrated in FIGS. 16 and 18, a change of integral nonlinearity is considered to be a maximum at a center code (CS=0). The function f reflects such a characteristic.

The function f is not limited to Formula (1) and Formula (2). For example, in Formula (1), f (CS) is monotonically reduced from CS=−31 toward CS=−1, f (CS) rapidly changes in a positive direction when CS=0, and f (CS) is monotonically reduced from CS=+1 toward CS=+31. Since such a characteristic is determined by a configuration and an operation of the D/A conversion circuit for code data, in a case where the D/A conversion circuit for code data of a different configuration or a different operation is adopted, the function f may be set according to the respective items.

Figure 9:
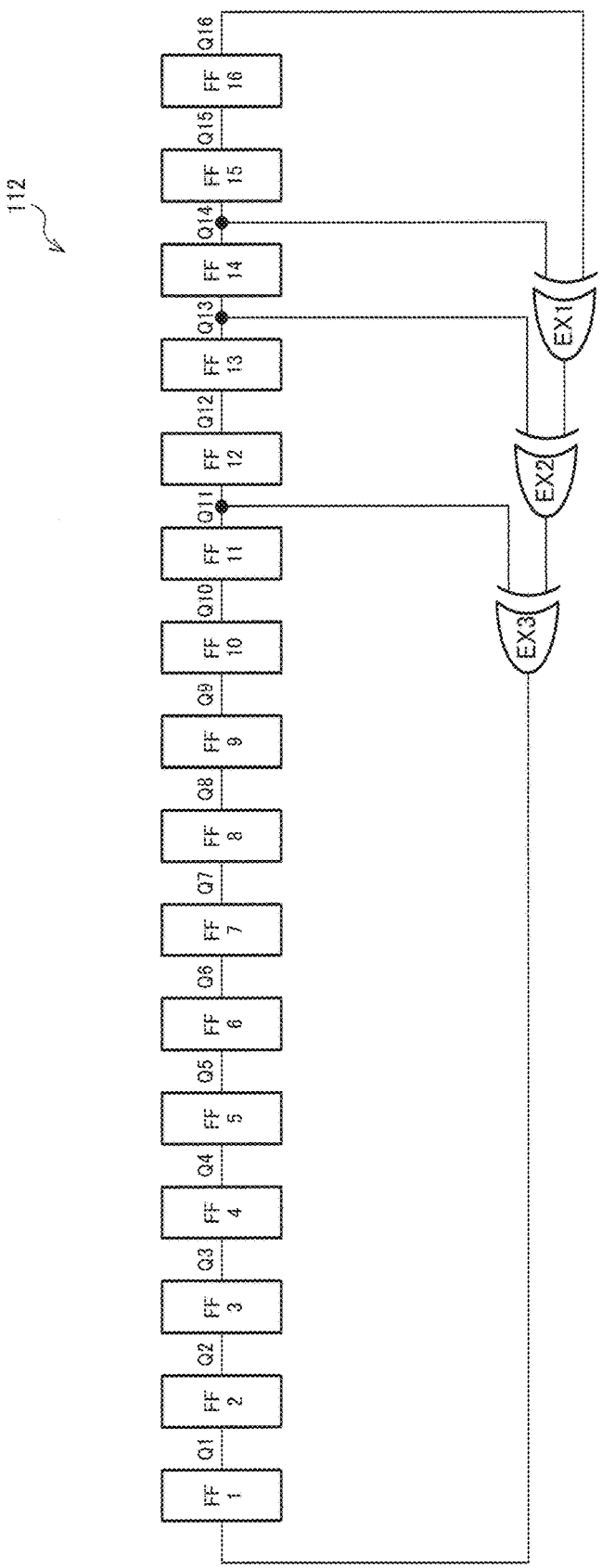
FIG. 9 is a detailed configuration example of a data generation circuit.

FIG. 9 is a detailed configuration example of a data generation circuit. The data generation circuit 112 includes flip-flop circuits FF1 to FF16 and exclusive OR circuits EX1 to EX3.

Outputs Q1 to Q15 of the flip-flop circuits FF1 to FF15 are input to data input terminals of the flip-flop circuits FF2 to FF16. The exclusive OR circuit EX1 outputs exclusive OR of the outputs Q14 and Q16 of the flip-flop circuits FF14 and FF16. The exclusive OR circuit EX2 outputs exclusive OR of an output Q13 of the flip-flop circuit FF13 and an output of the exclusive OR circuit EX1. The exclusive OR circuit EX3 outputs exclusive OR of the output Q11 of the flip-flop circuit FF11 and an output of the exclusive OR circuit EX2. An output of the exclusive OR circuit EX3 is input to the data input terminal of the flip-flop circuit FF1.

As such, the data generation circuit 112 becomes a shift register (linear feedback shift register) fed back by the exclusive OR circuits EX1 to EX3. In the example of FIG. 9, 16-bit data Q[16:1] configured by Q1 to Q16 is generated, and the data Q[16:1] is pseudo random number data. If a frequency of a clock signal for operating the flip-flop circuits FF1 to FF16 is referred to as fck, the data Q[16:1] circulates in a cycle $2^{16}$/fck. For example, a part of the data Q[16:1] is used as the generation data DAR. For example, in a case where the code data CS has six bits (−31 to +31), data Q[6:1] of six bits in a lower level among the data Q[16:1] is output as the generation data DAR.

According to the above embodiment, the data generation circuit 112 generates pseudo random number data as the generation data DAR.

By doing so, it is possible to generate the code data CS, based on the pseudo random number data. Although periodicity of the code data CS can be reduced by using the pseudo random number data, the periodicity remains in the code data CS in accordance with an operation cycle of the data generation circuit 112, as illustrated in FIG. 3. In the present embodiment, influence on the periodicity of the code data CS can be reduced by modulating (shaping the frequency characteristic) the pseudo random number data to generate the code data CS.

The data generation circuit 112 is not limited to the configuration of FIG. 9, and any circuit may be used as long as the pseudo random number data can be generated.

Figure 10:
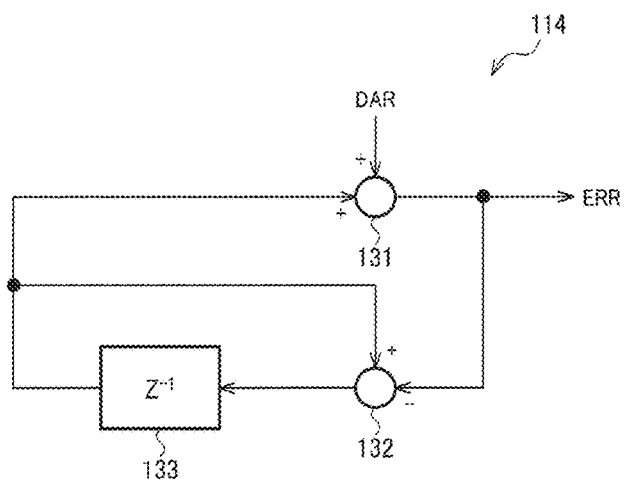
FIG. 10 is a detailed configuration example of a modulation circuit.

FIG. 10 is a detailed configuration example of the modulation circuit. The modulation circuit 114 includes an addition processing unit 131 (subtraction circuit), a subtraction processing unit 132 (subtraction circuit), and a delay unit 133 (register, flip-flop circuit).

The addition processing unit 131 adds the generation data DAR to an output of the delay unit 133, and outputs the result as the error data ERR. The subtraction processing unit 132 subtracts an output of the addition processing unit 131 from the output of the delay unit 133, and outputs the result. The delay unit 133 stores (latches) the output of the subtraction processing unit 132 and outputs the stored data. The modulation circuit 114 is a ΔΣ modulation circuit that performs first-order ΔΣ modulation for the generation data DAR. For example, the modulation circuit 114 is realized by a DSP, a dedicated logic circuit, and the like. In a case of using the DSP, a function of the modulation circuit 114 is realized by a part of a plurality of processes performed by the DSP in a time sharing manner.

Figure 11:
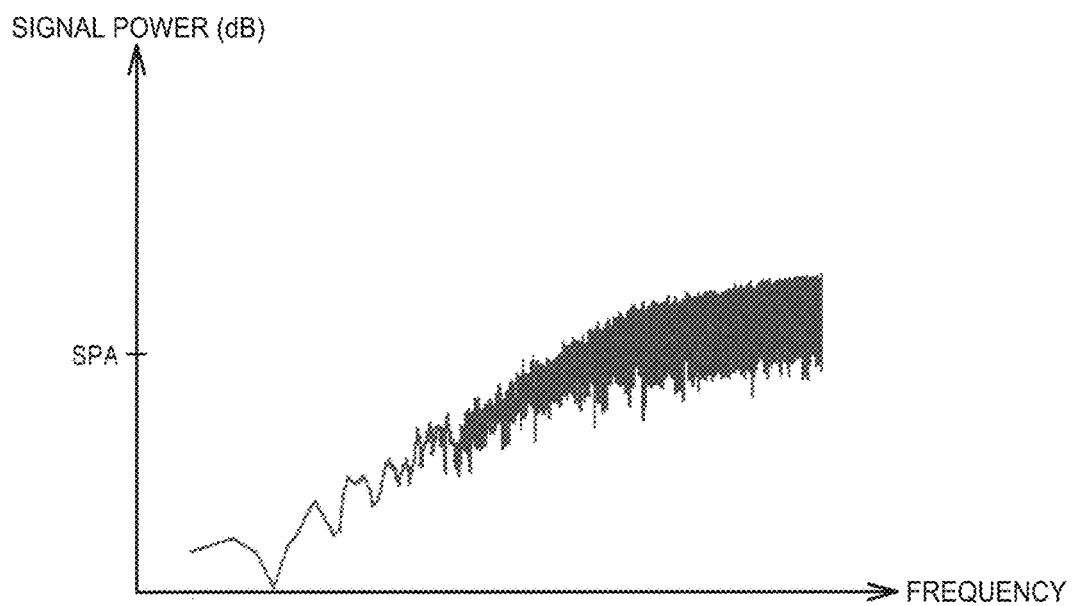
FIG. 11 is an example of a frequency characteristic of an error of A/D conversion data due to code shift, in the present embodiment.
Figure 12:
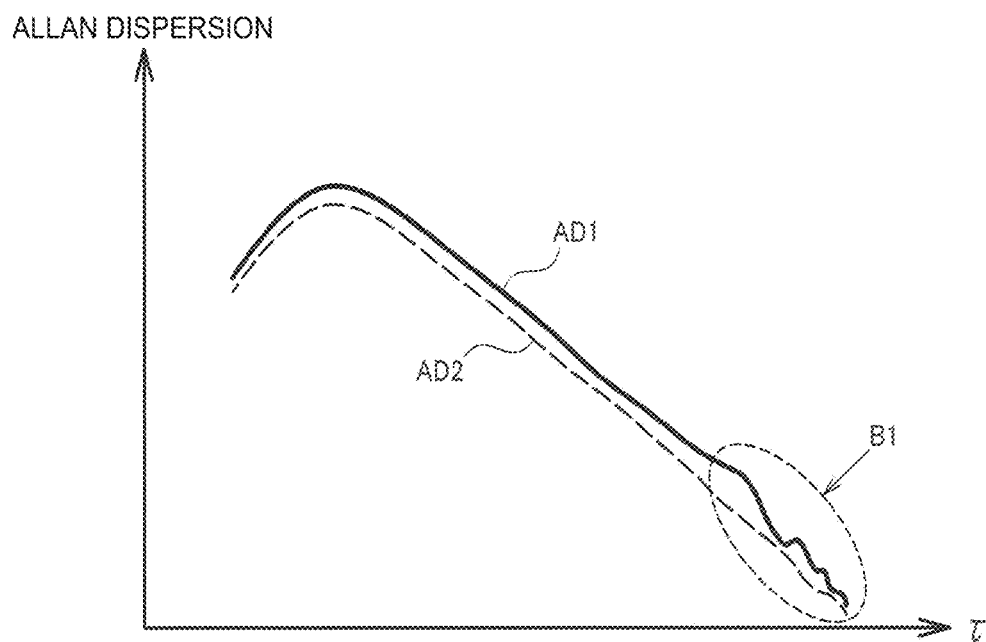
FIG. 12 is an example of an Allan dispersion characteristic of the A/D conversion data in the comparative example and the present embodiment.

FIG. 11 is an example of the frequency characteristic of the error of the A/D conversion data due to the code shift in the present embodiment. FIG. 11 illustrates simulation results obtained by performing Fourier-transformation of a time change of an error in a case where FIGS. 8 to 10 are applied to FIG. 6. FIG. 12 is an example of the Allan dispersion characteristic of the A/D conversion data in the comparative example and the present embodiment. AD1 is the Allan dispersion characteristic of the comparative example illustrated in FIG. 5, and AD2 is the Allan dispersion characteristic in the present embodiment.

As illustrated in FIG. 11, the frequency characteristic of the error of the A/D conversion data is shaped by the first order ΔΣ modulation. It can be seen that the frequency components (signal power) on a low frequency side are greatly reduced as compared with a signal power level SPA in the comparative example. Thereby, as denoted by B1 in FIG. 12, the Allan dispersion characteristic in a region where t is large is improved as compared with the comparative example. That is, disruption (peak) of the Allan dispersion characteristic due to the frequency components of the error is reduced. In addition, since the frequency components (signal power) on the low frequency side of the error are reduced, a floor of the Allan dispersion characteristic is lowered, and the overall characteristics of the Allan dispersion are improved.

According to the above embodiment, the modulation circuit 114 performs ΔΣ modulation of an n-th order (n is an integer of one or more) for the generation data DAR to generate the error data ERR.

By doing so, it is possible to provide the error data ERR with the shaping characteristic illustrated in FIG. 11. In the present embodiment, since the error data De (CS) of the A/D conversion data DOUT has the same (substantially the same) frequency characteristic as the error data ERR, it is possible to provide the error data De (CS) of the A/D conversion data DOUT with the shaping characteristic.

The first-order ΔΣ modulation circuit is illustrated in FIG. 10 as an example, but the modulation circuit 114 may be a second-order or higher modulation circuit. The order of the ΔΣ modulation circuit corresponds to the number of feedback loops included in the ΔΣ modulation circuit.

4. Modification Example

Figure 13:
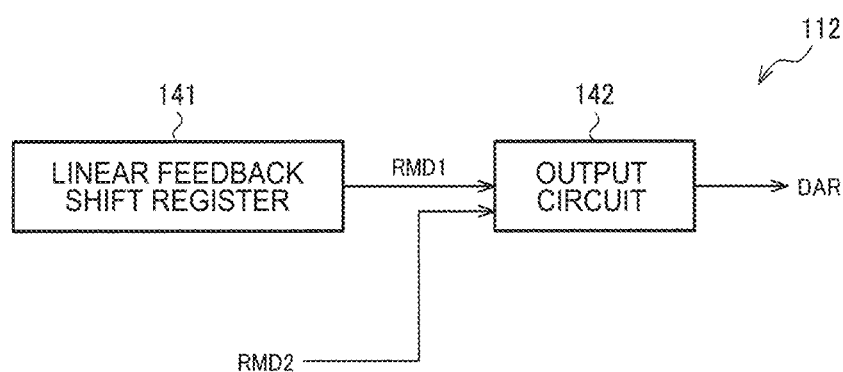
FIG. 13 is a modification example of the data generation circuit.

FIG. 13 is a modification example of the data generation circuit. In FIG. 13, the data generation circuit 112 includes a linear feedback shift register 141 and an output circuit 142.

The linear feedback shift register 141 generates pseudo random number data RMD1 (first random number data). The linear feedback shift register 141 is, for example, the linear feedback shift register of FIG. 9. The output circuit 142 outputs the generation data DAR, based on the pseudo random number data RMD1 and second random number data RMD2. For example, processing (for example, replacement, calculation, combination, or the like) is performed for the pseudo random number data RMD1 by using the second random number data RMD2 and the generation data DAR is generated. The second random number data RMD2 is, for example, random number data output by a circuit inside the circuit device 100 or random number data supplied from the outside of the circuit device 100. For example, the data generation circuit 112 may include a pseudo random number data generation circuit different from the linear feedback shift register 141, and the pseudo random number data generation circuit may output the second random number data RMD2.

According to the above embodiment, the data generation circuit 112 outputs the generation data DAR, based on the pseudo random number data RMD1 and the second random number data RMD2.

By doing so, the generation data DAR with higher randomness can be generated. For example, in a case where occurrence frequency of each code of the generation data DAR is not uniform, the occurrence frequency can be made more uniform.

FIG. 14 is a diagram illustrating an operation of the modification example of the data generation circuit. FIG. 14 illustrates an example of a case where two's complement of four bits is generated as the code data CS. In this case, the generation data DAR also becomes two's complement of four bits.

The pseudo random number data RMD1 with four bits can have values of 0000 to 1111 in binary. The pseudo random number data have 0 to 15 in decimal, and these are 16 values. Meanwhile, the two's complement of four bits is −7 to +7 in decimal, and the number of values is 15. Accordingly, if it is attempted to generate the generation data DAR which is two's complement from the pseudo random number data RMD1, one value is left. For example, if it is assumed that 1 to 15 of the pseudo random number data RMD1 are converted into −7 to +7 of the generation data DAR, 0 of the pseudo random number data RMD1 is left. For example, it is assumed that the remaining 0 corresponds to 0 of the generation data DAR. At this time, if it is assumed that occurrence frequency of each code of the pseudo random number data RMD1 is uniform, the occurrence frequency of DAR=0 is twice the occurrence frequency of a code other than 0.

In the present embodiment, in a case where the pseudo random number data is RMD1=0, the second random number data RMD2 is allocated, and the second random number data RMD2 is converted into the generation data DAR. If occurrence frequency of each code of the second random number data RMD2 is uniform, the occurrence frequency of RMD1=0 is dispersed to each code of the generation data DAR. By doing so, the occurrence frequency of each code of the generation data DAR can be made uniform.

5. A/D Conversion Circuit

Figure 15:
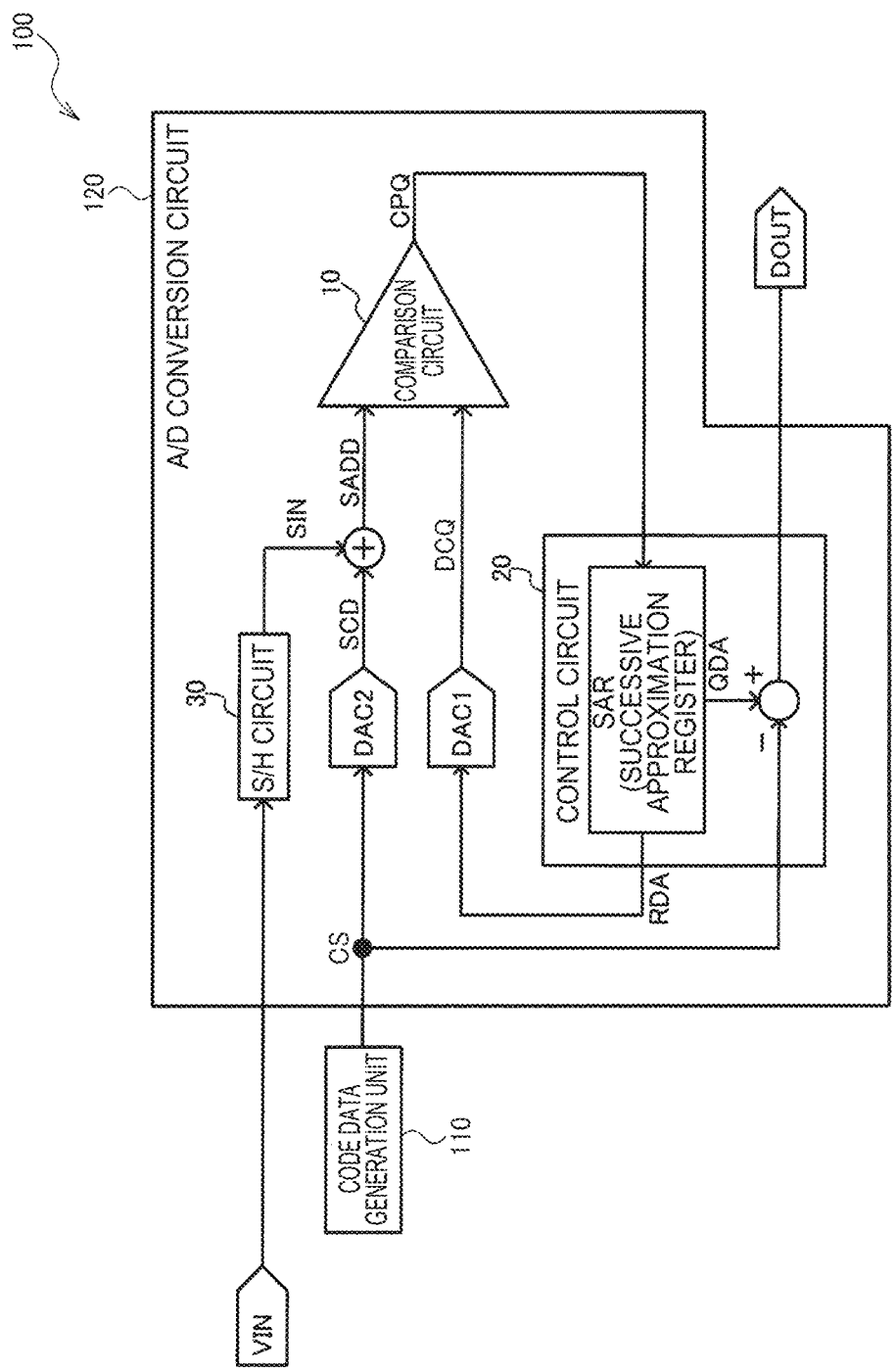
FIG. 15 is a configuration example of an A/D conversion circuit.

FIG. 15 is a configuration example of the A/D conversion circuit. The A/D conversion circuit 120 includes the comparison circuit 10, the control circuit 20, a first D/A conversion circuit DAC1, a second D/A conversion circuit DAC2, and the S/H circuit 30 (sample and hold circuit). The second D/A conversion circuit DAC2 corresponds to the D/A conversion circuit 121 for code data of FIG. 7. The present embodiment is not limited to the configuration of FIG. 15, and various modifications such as omitting a part of the configuration elements and adding other configuration elements can be made.

The comparison circuit 10 is realized by a comparator and performs comparison processing between a signal SADD and a signal DCQ. For example, the comparison circuit 10 is a time domain type comparator which converts an input signal into time (for example, a pulse width or delay time of a pulse) for comparison. For example, the time domain type comparator includes a first voltage time conversion circuit, a second voltage time conversion circuit, and a determination circuit. The first voltage time conversion circuit delays a pulse signal by a delay time corresponding to a difference between the first input signal DCQ and the second input signal SADD. The second voltage time conversion circuit delays a pulse signal by a delay time corresponding to a difference between the second input signal SADD and the first input signal DCQ. The determination circuit compares the pulse signal delayed by the first voltage time conversion circuit with the pulse signal delayed by the second voltage time conversion circuit, and determines a magnitude of the first input signal and a magnitude of the second input signal.

The control circuit 20 includes the successive approximation register SAR and outputs successive approximation data RDA stored in the successive approximation register SAR. The successive approximation register SAR is a register of which a register value is set by a comparison result signal CPQ from the comparison circuit 10. For example, in a case where the comparison circuit 10 performs successive approximation processing from the MSB to the LSB, comparison processing results ("1" and "0") of the respective bits are stored as each register value of the successive approximation register SAR.

The control circuit 20 can also control each circuit block of the A/D conversion circuit. For example, the control circuit can control turn-on and turn-off of switching elements (switch array) included in the D/A conversion circuits DAC1 and DAC2.

The D/A conversion circuit DAC1 (D/A conversion circuit for successive approximation data) performs D/A conversion of the successive approximation data RDA from the control circuit 20. The D/A conversion circuit outputs the D/A output signal DCQ corresponding to the successive approximation data RDA. The D/A conversion circuit DAC1 may be a charge redistribution type which uses a capacitor array, or a part or the whole thereof may be a ladder resistance type.

The D/A conversion circuit DAC2 performs D/A conversion of the code data CS. The D/A conversion circuit outputs a code signal SCD corresponding to the code data CS. Here, the code data CS is digital data which changes in each predetermined timing, and is data which becomes a different value in each A/D conversion timing once or more times.

The S/H circuit 30 samples and holds the input signal VIN which is a target of A/D conversion. In a case of the charge redistribution type, a function of the S/H circuit 30 can be realized by a D/A conversion circuit.

In the present embodiment, the comparison circuit 10 performs processing of comparing the addition signal SADD obtained by adding the sampling signal SIN of the input signal VIN to the code signal SCD with the D/A output signal DCQ. The comparison circuit 10 may perform processing of comparing the sampling signal SIN with an addition signal obtained by adding the D/A output signal DCQ to the code signal SCD.

The control circuit 20 outputs output data obtained based on the successive approximation result data QDA (final successive approximation data RDA after the successive approximation is completed) from the successive approximation register SAR and the code data CS as A/D conversion data DOUT of the input signal VIN. For example, in a case where comparison processing of comparing the addition signal SADD obtained by adding the sampling signal SIN to the code signal SCD with the D/A output signal DCQ is performed, the control circuit 20 performs processing of subtracting the code data CS from the successive approximation result data QDA. Meanwhile, in a case where comparison processing of comparing the sampling signal SIN with an addition signal obtained by adding the D/A output signal DCQ to the code signal SCD is performed, the control circuit 20 performs processing of adding the code data CS to the successive approximation result data QDA.

In a case where the D/A conversion circuit DAC1 that performs D/A conversion of the successive approximation data RDA has nonlinearity (differential nonlinearity, integral nonlinearity), the nonlinearity is a factor causing nonlinearity in the A/D conversion characteristic of the A/D conversion circuit 120. For example, there is a possibility that a specified code of the A/D conversion data becomes a missing code. In the present embodiment, the successive approximation result data QDA can be changed with respect to the (identical) input signal VIN by using the code data CS changing with time. Thereby, the nonlinearity is dispersed with time, and a characteristic of the A/D conversion circuit viewed in time average can be improved. For example, codes generated by the missing code can be dispersed with time.

Figure 16:
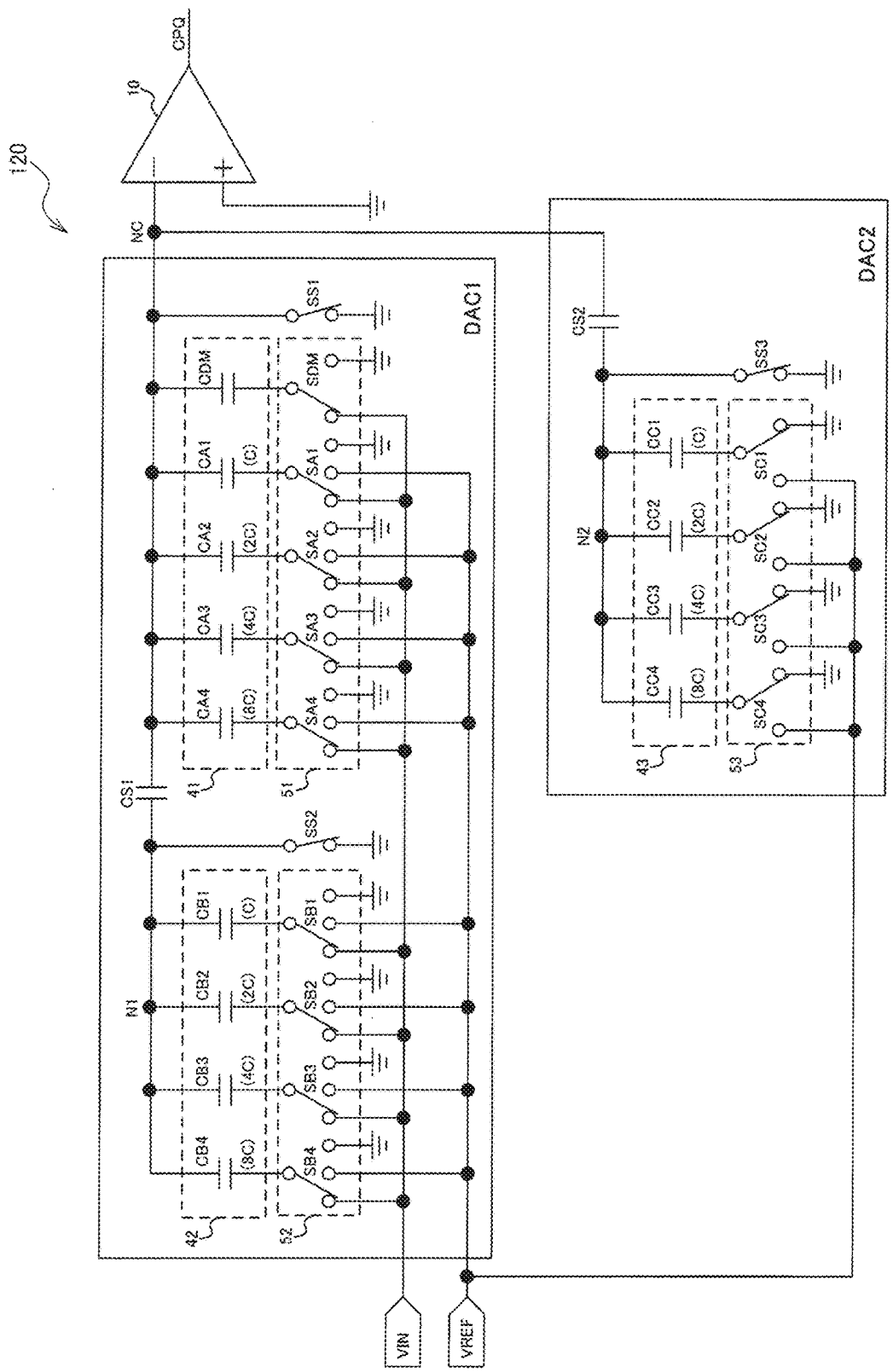
FIG. 16 is a first detailed configuration example of the A/D conversion circuit.

FIG. 16 is a first detailed configuration example of the A/D conversion circuit. FIG. 16 illustrates a detailed configuration example of the DAC1, the DAC2, and the comparison circuit 10 in FIG. 15, and the DAC1 and the DAC2 are configured by a charge redistribution type D/A conversion circuit.

The first D/A conversion circuit DAC1 includes a first capacitor array portion 41 and a first switch array portion 51. In addition, the first D/A conversion circuit includes a first series capacitor CS1 provided between a comparison node NC and a first node N1. In addition, DAC1 includes a second capacitor array portion 42 and a second switch array portion 52. In addition, the first D/A conversion circuit includes switch elements SS1 and SS2 that set the nodes NC and N1 to the ground voltage GND (power supply voltage, reference voltage) during the sampling period.

The first capacitor array portion 41 includes a plurality of capacitors CA1 to CA4. One terminal of each of the capacitors CA1 to CA4 is connected to a comparison node NC of the comparison circuit 10. Here, the comparison node NC (sampling node) is connected to a first input terminal (inverting input terminal) of the comparison circuit 10, and a second input terminal (non-inverting input terminal) of the comparison circuit 10 is connected to GND. In addition, the capacitors CA1 to CA4 are weighted in binary. For example, capacitance values of CA1, CA2, CA3, and CA4 are C, 2C, 4C, and 8C in a case of four bits. In addition, the first capacitor array portion 41 also includes a dummy capacitor CDM.

The first switch array portion 51 includes a plurality of switch elements SA1 to SA4. These switch elements SA1 to SA4 are respectively connected to the other terminals of the capacitors CA1 to CA4 of the first capacitor array portion 41. The switch elements SA1 to SA4 are switch-controlled based on the data (for example, data of four bits of a high level in a case where RDA has eight bits) of high bits of the successive approximation data RDA.

The second capacitor array portion 42 includes a plurality of capacitors CB1 to CB4. One terminal of each of the capacitors CB1 to CB4 is connected to the first node N1.

Here, the first node N1 is a node on the other terminal side of the series capacitor CS1, one terminal of which is connected to the comparison node NC. In addition, the capacitors CB1 to CB4 are weighted in binary, and for example, capacitance values of CB1, CB2, CB3, and CB4 are C, 2C, 4C, and 8C in a case of four bits.

The second switch array portion 52 includes a plurality of switch elements SB1 to SB4. The switch elements SB1 to SB4 are respectively connected to the other terminals of the capacitors CB1 to CB4 of the second capacitor array portion 42. The switch elements SB1 to SB4 are switch-controlled based on the data (for example, data of four bits of a low level in a case where RDA has eight bits) of low bits of the successive approximation data RDA.

The second D/A conversion circuit DAC2 includes a second series capacitor CS2 provided between the comparison node NC and the second node N2. In addition, the second D/A conversion circuit includes a third capacitor array portion 43 and a third switch array portion 53. In addition, the second D/A conversion circuit includes a switch element SS3 for setting the second node N2 to GND during the sampling period.

The third capacitor array portion 43 includes a plurality of capacitors CC1 to CC4. One terminal of each of the capacitors CC1 to CC4 is connected to the second node N2. Here, the second node N2 is a node on the other terminal side of the series capacitor CS2, one terminal of which is connected to the comparison node NC. In addition, the capacitors CC1 to CC4 are weighted in binary, and for example, capacitance values of CC1, CC2, CC3, and CC4 are C, 2C, 4C, and 8C in a case of four bits.

The third switch array portion 53 of DAC2 includes a plurality of switch elements SC1 to SC4. The switch elements SC1 to SC4 are connected to the other terminals of the capacitors CC1 to CC4 of the third capacitor array portion 43. The switch elements SC1 to SC4 are switch-controlled based on the code data CS.

Figure 17:
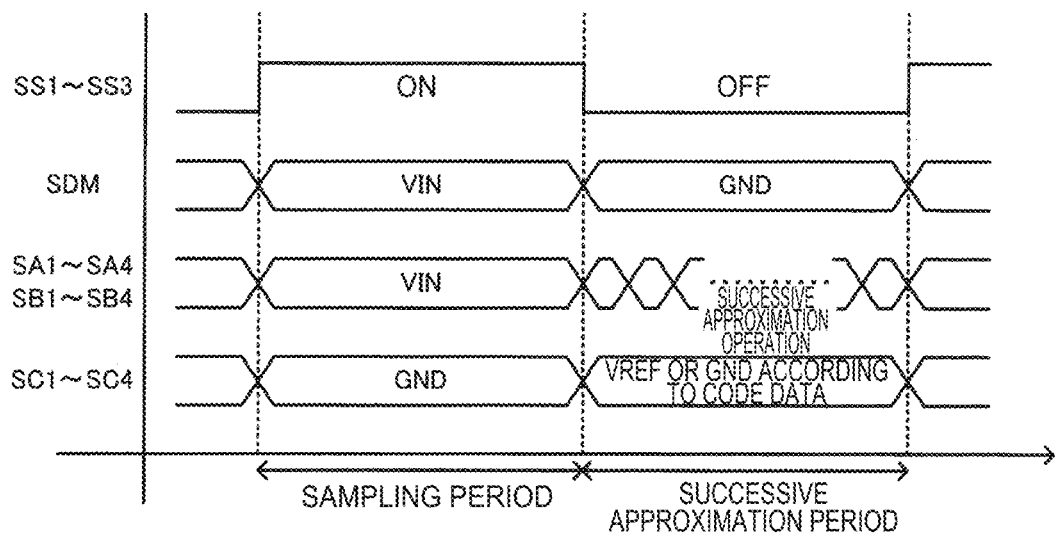
FIG. 17 is a diagram illustrating an operation of the first detailed configuration example of the A/D conversion circuit.

FIG. 17 is a diagram illustrating an operation of the first detailed configuration example of the A/D conversion circuit. As illustrated in FIG. 17, during a sampling period of the input signal VIN, the switch elements SS1 and SS2 of the D/A conversion circuit DAC1 are turned on, and the nodes NC and N1 are set to GND. In addition, the other terminals of the capacitors CA1 to CA4 and CB1 to CB4 are set to a voltage level of VIN through the switch elements SA1 to SA4 and SB1 to SB4 of the D/A conversion circuit DAC1.

Thereby, the input signal VIN is sampled. If the switch elements SA1 to SA4 and SB1 to SB4 are turned off, a voltage of the input signal VIN at that timing is held. During the sampling period, the other terminal of the dummy capacitor CDM is set to a voltage level of VIN via the switching element SDM for a dummy capacitor.

In addition, during the sampling period, the switching element SS3 of the D/A conversion circuit DAC2 for code shift is turned on, and the node N2 is set to GND. The other terminals of the capacitors CC1 to CC4 are set to GND via the switch elements SC1 to SC4. Thereby, both terminals of the capacitors CC1 to CC4 are set to GND, and electric charges are not accumulated.

Next, during a successive approximation period of A/D conversion, the switch elements SS1 and SS2 of the D/A conversion circuit DAC1 are turned off. In addition, the other terminal of the switching element SDM for a dummy capacitor is set to GND.

The switch elements SA1 to SA4 and SB1 to SB4 of DAC1 are switch-controlled based on each bit of the successive approximation data RDA, and the other terminals of the capacitors CA1 to CA4 and CM to CB4 are set to VREF or GND. For example, in a case where the successive approximation data is RDA=10000000, the other terminal of the capacitor CA4 corresponding to the MSB of RDA is set to the reference voltage VREF. The other terminals of the other capacitors CA3 to CA1 and CB4 to CM are set to GND.

In addition, during the successive approximation period of A/D conversion, the switch element SS3 of the D/A conversion circuit DAC2 is turned off. The switch elements SC1 to SC4 of DAC2 are switch-controlled based on each bit of the code data CS, and the other terminals of the capacitors CC1 to CC4 are set to VREF or GND. For example, in a case where the code data is CDA=1000, the other terminal of the capacitor CC4 is set to VREF, and the other terminals of the other capacitors CC3 to CC1 are set to GND.

In the charge redistribution type A/D conversion circuit illustrated in FIG. 16, comparison processing of comparing the sampling signal of VIN with the addition signal obtained by adding the D/A output signal to the code signal is performed. In this case, the control circuit 20 of FIG. 15 performs processing of adding the code data CS to the successive approximation result data QDA.

FIG. 18 is a second detailed configuration example of the A/D conversion circuit. FIG. 18 illustrates a configuration example of a fully differential type A/D conversion circuit. The A/D conversion circuit 120 includes the comparison circuit 10, a first D/A conversion circuit DAC1P connected to a non-inverting input terminal of the comparison circuit 10, and a second D/A conversion circuit DAC1N connected to an inverting input terminal of the comparison circuit 10. In addition, the A/D conversion circuit 120 includes a third D/A conversion circuit DAC2P connected to a non-inverting input terminal of the comparison circuit 10 and a fourth D/A conversion circuit DAC2N connected to an inverting input terminal.

Configurations of the D/A conversion circuits DAC1P and DAC1N include a capacitor array portion and a switch array portion, in the same manner as the D/A conversion circuit DAC1 in FIG. 16. An input signal PIN on a non-inverting side (positive side) configuring a differential signal is input to the DAC1P, and an input signal NIN on an inverting side (negative side) configuring a differential signal is input to DAC1N.

During the sampling period, nodes NCP and N1P of DAC1P are set to a common voltage (intermediate voltage) VCM by the switch elements SS1P and SS2P. In addition, nodes NCN and N1N of DAC1N are set to the common voltage VCM by the switch elements SS1N and SS2N. During the sampling period, one terminal of each of the switch elements SA1P to SA4P and SB1P to SB4P of DAC1P is connected to the signal PIN on the non-inverting side of the differential signal, and one terminal of each of the switch elements SA1N to SA4N and SB1N to SB4N of DAC1N is connected the signal NIN on the inverting side of the differential signal.

Meanwhile, during the successive approximation period, one terminal of each of the switch elements SA1P to SA4P and SB1P to SB4P of DAC1P is connected to VREF in a case where the corresponding bit of the successive approximation data is "1", and is connected to GND in a case where the corresponding bit of the successive approximation data is "0". Meanwhile, one terminal of each of the switch elements SA1N to SA4N and SB1N to SB4N of DAC1N is connected to GND in a case where the corresponding bit of the successive approximation data is "1", and is connected to VREF in a case where the corresponding bit of the successive approximation data is "0".

The D/A conversion circuits DAC2P and DAC2N include a capacitor array portion and a switch array portion, respectively in the same manner as the D/A conversion circuit DAC2 for code shift in FIG. 16.

During the sampling period, a node N2P of DAC2P is set to VCM by the switch element SS3P. In addition, a node N2N of the DAC2N is set to VCM by the switch element SS3N. One terminal of each of the switch elements SC1P to SC4P of DAC2P and one terminal of each of the switch elements SC1N to SC4N of DAC2N are connected to VCM.

Meanwhile, during the successive approximation period, one terminal of each of the switch elements SC1P to SC4P of DAC2P is connected to VREF in a case where the corresponding bit of the code data is "1", and is connected to GND in a case where the corresponding bit of the code data is "0". Meanwhile, one terminal of each of the switch elements SC1N to SC4N of DAC2N is connected to GND in a case where the corresponding bit of the code data is "1", and is connected to VREF in a case where the corresponding bit of the code data is "0".

6. Physical Quantity Measurement Device

Figure 19:
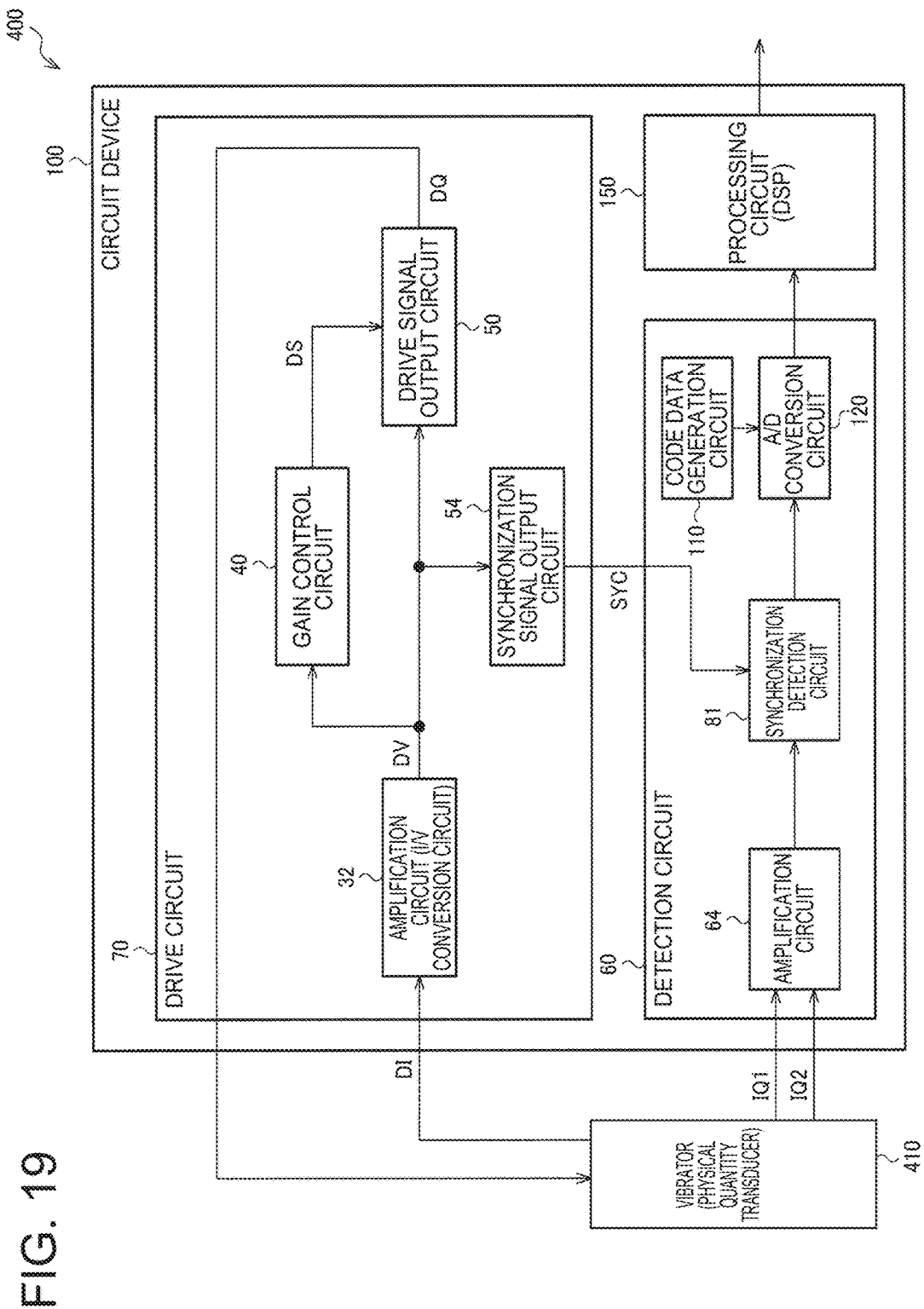
FIG. 19 is a configuration example of a physical quantity measurement device.

FIG. 19 is a configuration example of a physical quantity measurement device including the circuit device according to the present embodiment. The physical quantity measurement device 400 includes a physical quantity transducer and the circuit device 100. The circuit device 100 includes a drive circuit 70 that drives the physical quantity transducer, and a detection circuit 60 that receives a detection signal from the physical quantity transducer and detects a physical quantity signal corresponding to a physical quantity. The detection circuit 60 includes the A/D conversion circuit 120 that performs A/D conversion of an input signal, based on the detection signal.

The physical quantity transducer is an element or a device that detects a physical quantity. The physical quantity is, for example, angular velocity, angular acceleration, velocity, acceleration, distance, pressure, sound pressure, magnetic amount or time, and the like. The circuit device 100 may detect the physical quantity, based on detection signals from a plurality of physical quantity transducers. For example, the first to third physical quantity transducers detect physical quantities of a first axis, a second axis, and a third axis, respectively. The physical quantities of the first axis, the second axis, and the third axis are, for example, angular velocities or angular accelerations around the first axis, the second axis, and the third axis, or are velocities or accelerations in directions of the first axis, the second axis, and the third axis. The first axis, the second axis, and the third axis are, for example, the X axis, the Y axis, and the Z axis, respectively. Only the physical quantities of two axes among the first axis to the third axis may be detected.

FIG. 19 illustrates a configuration example of a gyro sensor that detects angular velocity as an example of the physical quantity measurement device. In FIG. 19, the physical quantity measurement device 400 includes a vibrator 410 as a physical quantity transducer. In addition, the circuit device 100 may include a processing circuit 150 (DSP).

The vibrator 410 (angular velocity detection element) detects Coriolis force acting on the vibrator 410 by rotation on a predetermined axis and outputs a signal corresponding to the Coriolis force. The vibrator 410 is, for example, a piezoelectric vibrator. The vibrator 410 is, for example, a quartz crystal oscillator or the like of a double T-shape, a T-shape, a tuning fork type, or the like. A micro electro mechanical systems (MEMS) vibrator or the like as a silicon vibrator formed by using a silicon substrate may be adopted as the vibrator 410.

The drive circuit 70 includes an amplification circuit 32 to which a feedback signal DI from the vibrator 410 is input, a gain control circuit 40 that performs an automatic gain control, and a drive signal output circuit 50 that outputs a drive signal DQ to the vibrator 410. In addition, the drive circuit 70 includes a synchronization signal output circuit 54 that outputs a synchronization signal SYC to the detection circuit 60.

The amplification circuit 32 (I/V conversion circuit) amplifies a feedback signal DI from the vibrator 410. For example, the amplification circuit converts the signal DI of a current from the vibrator 410 into a signal DV of a voltage and outputs the signal DV. The amplification circuit 32 can be realized by an operational amplifier, a feedback resistance element, a feedback capacitor, and the like.

The drive signal output circuit 50 outputs the drive signal DQ, based on the signal DV amplified by the amplification circuit 32. For example, in a case where the drive signal output circuit 50 outputs a drive signal of a rectangular wave (or a sine wave), the drive signal output circuit 50 can be realized by a comparator or the like.

The gain control circuit 40 (AGC) outputs a control voltage DS to the drive signal output circuit 50 to control an amplitude of the drive signal DQ. Specifically, the gain control circuit 40 monitors the signal DV and controls a gain of an oscillation loop. For example, the drive circuit 70 requires to keep the amplitude of a drive voltage supplied to the drive vibration unit of the vibrator 410 constant, in order to keep sensitivity of a gyro sensor constant. Accordingly, the gain control circuit 40 for automatically adjusting a gain is provided in an oscillation loop of a drive vibration system. The gain control circuit 40 variably and automatically adjusts the gain such that an amplitude (vibration speed of the drive vibration unit of the vibrator 410) of the feedback signal DI from the vibrator 410 is constant. The gain control circuit 40 can be realized by a full-wave rectifier that performs full-wave rectification of the output signal DV of the amplification circuit 32, an integrator that performs integration processing of an output signal of the full-wave rectifier, and the like.

The synchronization signal output circuit 54 receives the signal DV amplified by the amplification circuit and outputs the synchronization signal SYC (reference signal) to the detection circuit 60. The synchronization signal output circuit 54 can be realized by a comparator that performs binarization processing of the signal DV of a sine wave (alternating current) to generate the synchronization signal SYC of a rectangular wave, a phase adjustment circuit (phase shifting circuit) that adjusts a phase adjustment of the synchronization signal SYC, and the like.

The detection circuit 60 further includes an amplification circuit 64, a synchronization detection circuit 81, and a code data generation circuit 110. The amplification circuit 64 receives first and second detection signals IQ1 and IQ2 from the vibrator 410, and performs electric charge-voltage conversion, differential signal amplification, gain adjustment, and the like. The synchronization detection circuit 81 performs a synchronization detection, based on the synchronization signal SYC from the drive circuit 70. The A/D conversion circuit 120 performs code shift, based on code data from the code data generation circuit 110, and performs A/D conversion of a signal in which synchronization detection is completed. The processing circuit 150 performs digital filter processing and digital correction processing (for example, zero point correction processing, sensitivity correction processing, and the like) for a digital signal from the A/D conversion circuit 120.

7. Vehicle and Electronic Apparatus

Figure 20:
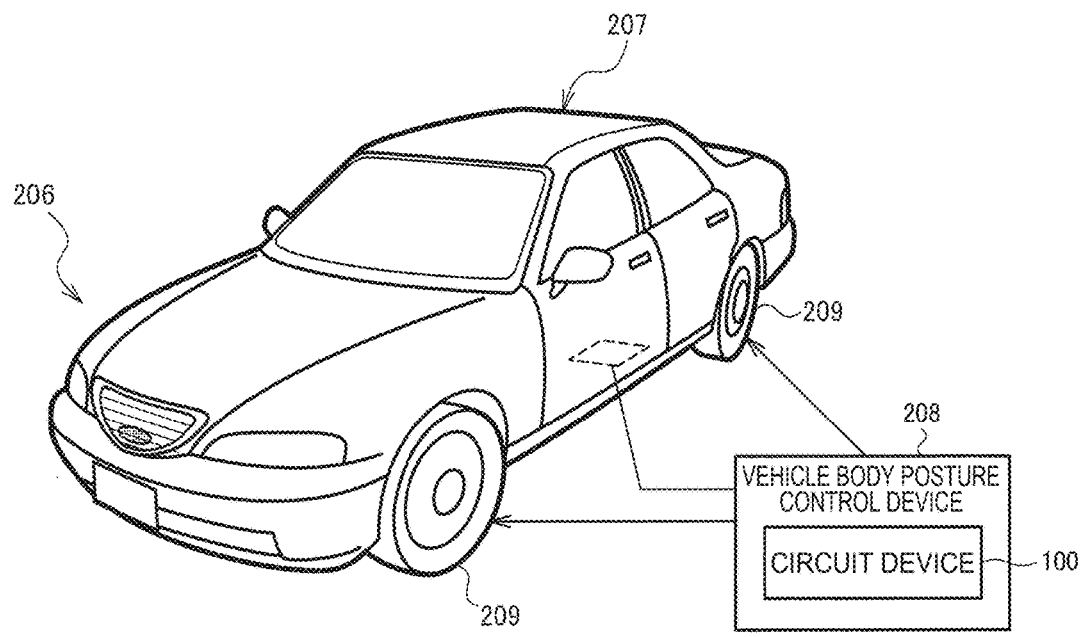
FIG. 20 is an example of a vehicle.
Figure 21:
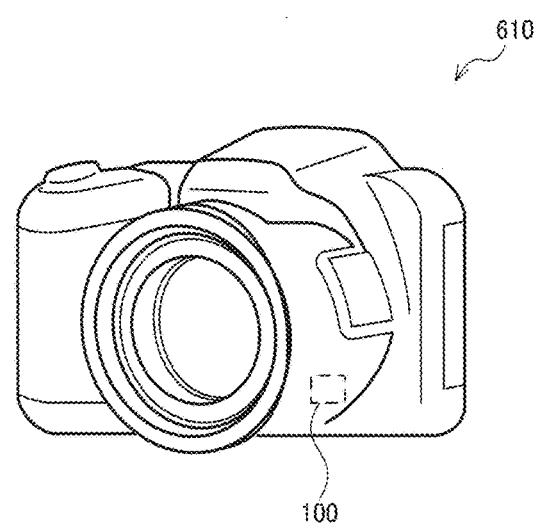
FIG. 21 is an example of an electronic apparatus.

FIG. 20 and FIG. 21 are examples of a vehicle and an electronic apparatus including the circuit device according to the present embodiment. The circuit device 100 according to the present embodiment can be incorporated into various vehicles such as a car, an airplane, a motorcycle, a bicycle, a ship, and the like. The vehicle is an apparatus or a device that includes a drive mechanism such as an engine or a motor, a steering mechanism such as a steering wheel or a rudder, and various kinds of electronic apparatuses, and moves on the ground, the sky, or the sea.

FIG. 20 schematically illustrates an automobile 206 as a specific example of the vehicle. A gyro sensor (not illustrated) including the circuit device 100 is incorporated in the automobile 206. The gyro sensor can detect a posture of a vehicle body 207. A detection signal of the gyro sensor is supplied to a vehicle body posture control device 208. For example, the vehicle body posture control device 208 can control hardness of a suspension in accordance with a posture of the vehicle body 207 or can control brakes of individual wheels 209. In addition, the posture control can be used in various vehicles such as a bipedal walking robot, an aircraft, a helicopter and the like. A gyro sensor can be incorporated to realize the posture control.

FIG. 21 schematically illustrates a digital still camera 610 as a specific example of an electronic apparatus. A gyro sensor (not illustrated) including the circuit device 100 and an acceleration sensor (not illustrated) are incorporated in the digital still camera 610. For example, the digital still camera 610 can perform camera shake correction by using the gyro sensor and the acceleration sensor. In addition, a biological information detection device (wearable health device such as a pulse rate meter, a pedometer, an activity meter, and the like) can be used as a specific example of the electronic apparatus. The biological information detection device can detect a body motion of a user or can detect a motion state by using the gyro sensor and the acceleration sensor. As such, the circuit device 100 according to the present embodiment can be applied to various electronic apparatuses such as the digital still camera 610 and the biological information detection device.

In addition, a robot can be used as a specific example of a vehicle or an electronic apparatus. The circuit device 100 according to the present embodiment can be applied to, for example, a movable portion (arm, joint) and a main body portion of a robot. The robot can be used for any of a vehicle (travel and walking robot) and an electronic apparatus (non-travel and non-walking robot). In a case of the travel and walking robot, for example, a gyro sensor (including the circuit device according to the present embodiment) can be used for an autonomous travel.

Although the present embodiments are described in detail as above, it will be easily understood by those skilled in the art that various modifications can be made without practically departing from novel matters and effects of the invention. Thus, all the modification examples are included in the scope of the invention. For example, in the specification or drawings, a term described at least once together with a different term that is broader or equivalent can be replaced with a different term at any point of the specification or the drawings. In addition, all combinations of the present embodiments and modification examples are also included in the scope of the invention. In addition, the configurations and operation of the code data generation circuit, the A/D conversion circuit, the circuit device, the physical quantity measurement device, the electronic apparatus, and the vehicle are not limited to those described in the present embodiments, and various modifications can be made.

The entire disclosure of Japanese Patent Application No. 2017-062056, filed Mar. 28, 2017 is expressly incorporated by reference herein.

What is claimed is:

1. A circuit device comprising:
a code data generation circuit configured to generate code data which changes with time;
a first D/A conversion circuit configured to perform D/A conversion of the code data; and
a successive approximation type A/D conversion circuit configured to perform code shift based on the code data and perform A/D conversion of an input signal,
wherein the code data generation circuit generates error data of which a frequency characteristic has a shaping characteristic and converts the error data into the code data, and wherein the code data generation circuit converts the error data into the code data by an inverse function of a function of converting the code data into the error data.

2. The circuit device according to claim 1,
wherein the A/D conversion circuit includes the first D/A conversion circuit configured to perform D/A conversion of the code data, and
wherein the function is a function based on a conversion characteristic of the first D/A conversion circuit.

3. The circuit device according to claim 1,
wherein, when the code data is referred to as CS, predetermined values corresponding to a range of the code data are referred to as CM and CA, the error data is referred to as ERR, and the function is referred to as f, ERR=f(CS)=(CM−CS)/CA at CS>0, ERR=f(CS)=0 at CS=0, ERR=f(CS)=−(CM+CS)/CA at CS<0.

4. The circuit device according to claim 1,
wherein the code data generation circuit includes a data generation circuit, a modulation circuit configured to modulate generation data from the data generation circuit to generate the error data, and a conversion circuit configured to converts the error data into the code data.

5. The circuit device according to claim 4,
wherein the modulation circuit performs ΔΣ modulation of an n-th order (n is an integer of one or more) for the generation data to generate the error data.

6. The circuit device according to claim 4,
wherein the data generation circuit generates pseudo random number data as the generation data.

7. The circuit device according to claim 6,
wherein the data generation circuit outputs the generation data, based on the pseudo random number data and first random number data.

8. The circuit device according to claim 1,
wherein the successive approximation type A/D conversion circuit includes
a comparison circuit,
a control circuit that includes a successive approximation register in which a register value is set by a comparison result signal from the comparison circuit and outputs successive approximation data, a first D/A conversion circuit configured to perform D/A conversion of the successive approximation data from the control circuit and output a D/A output signal corresponding to the successive approximation data, and a second D/A conversion circuit configured to perform D/A conversion of the code data and output a code signal corresponding to the code data, wherein the comparison circuit performs processing of comparing an addition signal which is obtained by adding a sampling signal of the input signal to the code signal with the D/A output signal, or performs processing of comparing the sampling signal with an addition signal which is obtained by adding the D/A output signal to the code signal, and wherein the control circuit outputs output data which is obtained based on successive approximation result data of the successive approximation register and the code data as A/D conversion data of the input signal.

9. The circuit device according to claim 1, further comprising:

a drive circuit configured to drive a physical quantity transducer; and a detection circuit configured to receive a detection signal from the physical quantity transducer and detect a physical quantity signal corresponding to physical quantity, wherein the detection circuit includes the A/D conversion circuit configured to perform A/D conversion of the input signal, based on the detection signal.

10. A physical quantity measurement device comprising:
the circuit device according to claim 9; and
the physical quantity transducer.

11. An electronic apparatus comprising:
the circuit device according to claim 1.

12. An electronic apparatus comprising:
the circuit device according to claim 2.

13. An electronic apparatus comprising:
the circuit device according to claim 3.

14. An electronic apparatus comprising:
the circuit device according to claim 4.

15. A vehicle comprising:
the circuit device according to claim 1.

16. A vehicle comprising:
the circuit device according to claim 2.

17. A vehicle comprising:
the circuit device according to claim 3.

* * * * *